(12) United States Patent
Bedworth

(10) Patent No.: US 9,870,895 B2
(45) Date of Patent: Jan. 16, 2018

(54) METHODS FOR PERFORATING TWO-DIMENSIONAL MATERIALS USING A BROAD ION FIELD

(71) Applicant: LOCKHEED MARTIN CORPORATION, Bethesda, MD (US)

(72) Inventor: Peter V. Bedworth, Los Gatos, CA (US)

(73) Assignee: Lockheed Martin Corporation, Bethesda, MD (US)

( * ) Notice: Subject to any disclaimer, the term of this patent is extended or adjusted under 35 U.S.C. 154(b) by 0 days.

(21) Appl. No.: 14/610,770

(22) Filed: Jan. 30, 2015

(65) Prior Publication Data

US 2015/0221474 A1 Aug. 6, 2015

Related U.S. Application Data

(60) Provisional application No. 61/934,530, filed on Jan. 31, 2014.

(51) Int. Cl.
| | |
|---|---|
| *H01J 37/31* | (2006.01) |
| *H05H 3/02* | (2006.01) |
| *B23K 15/06* | (2006.01) |
| *B23K 15/08* | (2006.01) |

(52) U.S. Cl.
CPC .................................... *H01J 37/31* (2013.01)

(58) Field of Classification Search
USPC ............. 250/309, 425, 442.11, 492.1, 492.2, 250/492.3, 492.23, 492.21, 526
See application file for complete search history.

(56) References Cited

U.S. PATENT DOCUMENTS

| | | |
|---|---|---|
| 2,187,417 A | 1/1940 | Doble |
| 3,024,153 A | 3/1962 | Kennedy |
| 3,303,085 A | 2/1967 | Price et al. |

(Continued)

FOREIGN PATENT DOCUMENTS

| | | |
|---|---|---|
| CA | 2037988 | 1/1900 |
| CA | 2411935 | 12/2002 |

(Continued)

OTHER PUBLICATIONS

Allen et al. (Oct. 2002), "Craters on silicon surfaces created by gas cluster ion impacts," Journal of Applied Physics, vol. 92, No. 7, pp. 3671-3678.

(Continued)

*Primary Examiner* — Bernard Souw
(74) *Attorney, Agent, or Firm* — Foley & Lardner LLP

(57) ABSTRACT

Perforating graphene and other two-dimensional materials with holes inclusively having a desired size range, a narrow size distribution, and a high hole density can be difficult to achieve. A layer in continuous contact with graphene, graphene-based materials and other two-dimensional materials can help promote hole formation. Processes for perforating a two-dimensional material can include exposing to an ion source a two-dimensional material in continuous contact with at least one layer, and interacting a plurality of ions from the ion source with the two-dimensional material and with the at least one layer. The ion source may be a broad ion beam.

23 Claims, 3 Drawing Sheets

(56) References Cited

U.S. PATENT DOCUMENTS

| | | | |
|---|---|---|---|
| 3,501,831 A * | 3/1970 | Gordon | H05K 3/326 174/263 |
| 3,593,854 A | 7/1971 | Swank | |
| 3,701,433 A | 10/1972 | Krakauer et al. | |
| 3,802,972 A | 4/1974 | Fleischer et al. | |
| 4,073,732 A | 2/1978 | Lauer et al. | |
| 4,159,954 A | 7/1979 | Gangemi | |
| 4,162,220 A | 7/1979 | Servas | |
| 4,277,344 A | 7/1981 | Cadotte | |
| 4,303,530 A | 12/1981 | Shah et al. | |
| 4,743,371 A | 5/1988 | Servas et al. | |
| 4,855,058 A | 8/1989 | Holland et al. | |
| 4,880,440 A | 11/1989 | Perrin | |
| 4,889,626 A | 12/1989 | Browne | |
| 4,891,134 A | 1/1990 | Vcelka | |
| 4,925,560 A | 5/1990 | Sorrick | |
| 4,935,207 A | 6/1990 | Stanbro et al. | |
| 4,976,858 A | 12/1990 | Kadoya | |
| 5,052,444 A | 10/1991 | Messerly et al. | |
| 5,080,770 A | 1/1992 | Culkin | |
| 5,156,628 A | 10/1992 | Kranz | |
| 5,182,111 A | 1/1993 | Aebischer et al. | |
| 5,185,086 A | 2/1993 | Kaali et al. | |
| 5,201,767 A | 4/1993 | Caldarise et al. | |
| 5,244,981 A | 9/1993 | Seidner et al. | |
| 5,314,492 A | 5/1994 | Hamilton et al. | |
| 5,314,960 A | 5/1994 | Spinelli et al. | |
| 5,314,961 A | 5/1994 | Anton et al. | |
| 5,331,067 A | 7/1994 | Seidner et al. | |
| 5,344,454 A | 9/1994 | Clarke et al. | |
| 5,371,147 A | 12/1994 | Spinelli et al. | |
| 5,425,858 A | 6/1995 | Farmer | |
| 5,480,449 A | 1/1996 | Hamilton et al. | |
| 5,514,181 A | 5/1996 | Light et al. | |
| 5,516,522 A | 5/1996 | Peyman et al. | |
| 5,549,697 A | 8/1996 | Caldarise | |
| 5,562,944 A | 10/1996 | Kafrawy | |
| 5,565,210 A | 10/1996 | Rosenthal et al. | |
| 5,580,530 A | 12/1996 | Kowatsch et al. | |
| 5,595,621 A | 1/1997 | Light et al. | |
| 5,636,437 A | 6/1997 | Kaschmitter et al. | |
| 5,639,275 A | 6/1997 | Baetge et al. | |
| 5,641,323 A | 6/1997 | Caldarise | |
| 5,658,334 A | 8/1997 | Caldarise et al. | |
| 5,662,158 A | 9/1997 | Caldarise | |
| 5,665,118 A | 9/1997 | Lasalle et al. | |
| 5,671,897 A | 9/1997 | Ogg et al. | |
| 5,679,232 A | 10/1997 | Fedor et al. | |
| 5,679,249 A | 10/1997 | Fendya et al. | |
| 5,687,788 A | 11/1997 | Caldarise et al. | |
| 5,700,477 A | 12/1997 | Rosenthal et al. | |
| 5,713,410 A | 2/1998 | Lasalle et al. | |
| 5,716,412 A | 2/1998 | Decarlo et al. | |
| 5,716,414 A | 2/1998 | Caldarise | |
| 5,725,586 A | 3/1998 | Sommerich | |
| 5,731,360 A | 3/1998 | Pekala et al. | |
| 5,733,503 A | 3/1998 | Kowatsch et al. | |
| 5,746,272 A | 5/1998 | Mastrorio et al. | |
| 5,782,286 A | 7/1998 | Sommerich | |
| 5,782,289 A | 7/1998 | Mastrorio et al. | |
| 5,788,916 A | 8/1998 | Caldarise | |
| 5,800,828 A | 9/1998 | Dionne et al. | |
| 5,808,312 A * | 9/1998 | Fukuda | G03F 1/24 250/492.2 |
| 5,868,727 A | 2/1999 | Barr et al. | |
| 5,897,592 A | 4/1999 | Caldarise et al. | |
| 5,902,762 A | 5/1999 | Mercuri et al. | |
| 5,906,234 A | 5/1999 | Mastrorio et al. | |
| 5,910,172 A | 6/1999 | Penenberg | |
| 5,910,173 A | 6/1999 | Decarlo et al. | |
| 5,913,998 A | 6/1999 | Butler et al. | |
| 5,925,247 A | 7/1999 | Huebbel | |
| 5,932,185 A | 8/1999 | Pekala et al. | |
| 5,935,084 A | 8/1999 | Southworth | |
| 5,935,172 A | 8/1999 | Ochoa et al. | |
| 5,954,937 A | 9/1999 | Farmer | |
| 5,974,973 A | 11/1999 | Tittgemeyer | |
| 5,976,555 A | 11/1999 | Liu et al. | |
| 5,980,718 A | 11/1999 | Van Konynenburg et al. | |
| 6,008,431 A | 12/1999 | Caldarise et al. | |
| 6,013,080 A | 1/2000 | Khalili | |
| 6,022,509 A | 2/2000 | Matthews et al. | |
| 6,052,608 A | 4/2000 | Young et al. | |
| 6,080,393 A | 6/2000 | Liu et al. | |
| 6,093,209 A | 7/2000 | Sanders | |
| 6,139,585 A | 10/2000 | Li | |
| 6,152,882 A | 11/2000 | Prutchi | |
| 6,156,323 A | 12/2000 | Verdicchio et al. | |
| 6,193,956 B1 | 2/2001 | Liu et al. | |
| 6,209,621 B1 | 4/2001 | Treacy | |
| 6,213,124 B1 | 4/2001 | Butterworth | |
| 6,228,123 B1 | 5/2001 | Dezzani | |
| 6,264,699 B1 | 7/2001 | Noiles et al. | |
| 6,292,704 B1 | 9/2001 | Malonek et al. | |
| 6,309,532 B1 | 10/2001 | Tran et al. | |
| 6,346,187 B1 | 2/2002 | Tran et al. | |
| 6,375,014 B1 | 4/2002 | Garcera et al. | |
| 6,426,214 B1 | 7/2002 | Butler et al. | |
| 6,454,095 B1 | 9/2002 | Brisebois et al. | |
| 6,455,115 B1 | 9/2002 | Demeyer | |
| 6,461,622 B2 | 10/2002 | Liu et al. | |
| 6,462,935 B1 | 10/2002 | Shiue et al. | |
| 6,521,865 B1 | 2/2003 | Jones et al. | |
| 6,532,386 B2 | 3/2003 | Sun et al. | |
| 6,580,598 B2 | 6/2003 | Shiue et al. | |
| 6,654,229 B2 | 11/2003 | Yanagisawa et al. | |
| 6,659,298 B2 | 12/2003 | Wong | |
| 6,660,150 B2 | 12/2003 | Conlan et al. | |
| 6,661,643 B2 | 12/2003 | Shiue et al. | |
| 6,692,627 B1 | 2/2004 | Russell et al. | |
| 6,695,880 B1 | 2/2004 | Roffman et al. | |
| 6,699,684 B2 | 3/2004 | Ho et al. | |
| 6,719,740 B2 | 4/2004 | Burnett et al. | |
| 6,905,612 B2 | 6/2005 | Dorian et al. | |
| 6,924,190 B2 | 8/2005 | Dennison | |
| 7,014,829 B2 | 3/2006 | Yanagisawa et al. | |
| 7,071,406 B2 | 7/2006 | Smalley et al. | |
| 7,092,753 B2 | 8/2006 | Darvish et al. | |
| 7,138,042 B2 | 11/2006 | Tran et al. | |
| 7,171,263 B2 | 1/2007 | Darvish et al. | |
| 7,175,783 B2 | 2/2007 | Curran | |
| 7,179,419 B2 | 2/2007 | Lin et al. | |
| 7,190,997 B1 | 3/2007 | Darvish et al. | |
| 7,267,753 B2 | 9/2007 | Anex et al. | |
| 7,306,768 B2 | 12/2007 | Chiga | |
| 7,357,255 B2 | 4/2008 | Ginsberg et al. | |
| 7,374,677 B2 | 5/2008 | McLaughlin et al. | |
| 7,381,707 B2 | 6/2008 | Lin et al. | |
| 7,382,601 B2 | 6/2008 | Yoshimitsu | |
| 7,434,692 B2 | 10/2008 | Ginsberg et al. | |
| 7,452,547 B2 | 11/2008 | Lambino et al. | |
| 7,459,121 B2 | 12/2008 | Liang et al. | |
| 7,460,907 B1 | 12/2008 | Darvish et al. | |
| 7,476,222 B2 | 1/2009 | Sun et al. | |
| 7,477,939 B2 | 1/2009 | Sun et al. | |
| 7,477,940 B2 | 1/2009 | Sun et al. | |
| 7,477,941 B2 | 1/2009 | Sun et al. | |
| 7,479,133 B2 | 1/2009 | Sun et al. | |
| 7,505,250 B2 | 3/2009 | Cho et al. | |
| 7,531,094 B2 | 5/2009 | McLaughlin et al. | |
| 7,600,567 B2 | 10/2009 | Christopher et al. | |
| 7,631,764 B2 | 12/2009 | Ginsberg et al. | |
| 7,650,805 B2 | 1/2010 | Nauseda et al. | |
| 7,674,477 B1 | 3/2010 | Schmid et al. | |
| 7,706,128 B2 | 4/2010 | Bourcier | |
| 7,761,809 B2 | 7/2010 | Bukovec et al. | |
| 7,786,086 B2 | 8/2010 | Reches et al. | |
| 7,866,475 B2 | 1/2011 | Doskoczynski et al. | |
| 7,875,293 B2 | 1/2011 | Shults et al. | |
| 7,935,331 B2 | 5/2011 | Lin | |
| 7,935,416 B2 | 5/2011 | Yang et al. | |
| 7,943,167 B2 | 5/2011 | Kulkarni et al. | |
| 7,960,708 B2 | 6/2011 | Wolfe et al. | |
| 7,998,246 B2 | 8/2011 | Liu et al. | |

(56) References Cited

U.S. PATENT DOCUMENTS

| | | |
|---|---|---|
| 8,109,893 B2 | 2/2012 | Lande |
| 8,147,599 B2 | 4/2012 | McAlister |
| 8,262,943 B2 | 9/2012 | Meng et al. |
| 8,308,702 B2 | 11/2012 | Batchvarova et al. |
| 8,316,865 B2 | 11/2012 | Ochs et al. |
| 8,329,476 B2 | 12/2012 | Pitkanen et al. |
| 8,361,321 B2 | 1/2013 | Stetson et al. |
| 8,449,504 B2 | 5/2013 | Carter et al. |
| 8,475,689 B2 | 7/2013 | Sun et al. |
| 8,506,807 B2 | 8/2013 | Lee et al. |
| 8,512,669 B2 | 8/2013 | Hauck |
| 8,513,324 B2 | 8/2013 | Scales et al. |
| 8,535,726 B2 | 9/2013 | Dai et al. |
| 8,592,291 B2 | 11/2013 | Shi et al. |
| 8,617,411 B2 | 12/2013 | Singh |
| 8,666,471 B2 | 3/2014 | Rogers et al. |
| 8,686,249 B1 | 4/2014 | Whitaker et al. |
| 8,697,230 B2 | 4/2014 | Ago et al. |
| 8,698,481 B2 | 4/2014 | Lieber et al. |
| 8,715,329 B2 | 5/2014 | Robinson et al. |
| 8,721,074 B2 | 5/2014 | Pugh et al. |
| 8,734,421 B2 | 5/2014 | Sun et al. |
| 8,744,567 B2 | 6/2014 | Fassih et al. |
| 8,751,015 B2 | 6/2014 | Frewin et al. |
| 8,753,468 B2 | 6/2014 | Caldwell et al. |
| 8,759,153 B2 | 6/2014 | Elian et al. |
| 8,808,257 B2 | 8/2014 | Pugh et al. |
| 8,828,211 B2 | 9/2014 | Garaj et al. |
| 8,840,552 B2 | 9/2014 | Brauker et al. |
| 8,857,983 B2 | 10/2014 | Pugh et al. |
| 8,861,821 B2 | 10/2014 | Osumi |
| 8,894,201 B2 | 11/2014 | Pugh et al. |
| 8,940,552 B2 | 1/2015 | Pugh et al. |
| 8,950,862 B2 | 2/2015 | Pugh et al. |
| 8,974,055 B2 | 3/2015 | Pugh et al. |
| 8,975,121 B2 | 3/2015 | Pugh et al. |
| 8,979,978 B2 | 3/2015 | Miller et al. |
| 8,986,932 B2 | 3/2015 | Turner et al. |
| 8,993,234 B2 | 3/2015 | Turner et al. |
| 8,993,327 B2 | 3/2015 | McKnight et al. |
| 9,014,639 B2 | 4/2015 | Pugh et al. |
| 9,017,937 B1 | 4/2015 | Turner et al. |
| 9,023,220 B2 | 5/2015 | Graphenea |
| 9,028,663 B2 | 5/2015 | Stetson et al. |
| 9,035,282 B2 | 5/2015 | Dimitrakopoulos et al. |
| 9,045,847 B2 | 6/2015 | Batchvarova et al. |
| 9,050,452 B2 | 6/2015 | Sun et al. |
| 9,052,533 B2 | 6/2015 | Pugh et al. |
| 9,056,282 B2 | 6/2015 | Miller et al. |
| 9,062,180 B2 | 6/2015 | Scales et al. |
| 9,067,811 B1 | 6/2015 | Bennett et al. |
| 9,070,615 B2 | 6/2015 | Elian et al. |
| 9,075,009 B2 | 7/2015 | Kim et al. |
| 9,080,267 B2 | 7/2015 | Batchvarova et al. |
| 9,095,823 B2 | 8/2015 | Fleming |
| 9,096,050 B2 | 8/2015 | Bedell et al. |
| 9,096,437 B2 | 8/2015 | Tour et al. |
| 9,102,111 B2 | 8/2015 | Pugh et al. |
| 9,108,158 B2 | 8/2015 | Yu et al. |
| 9,110,310 B2 | 8/2015 | Pugh et al. |
| 9,125,715 B2 | 9/2015 | Pugh et al. |
| 9,134,546 B2 | 9/2015 | Pugh et al. |
| 9,170,646 B2 | 10/2015 | Toner et al. |
| 9,185,486 B2 | 11/2015 | Pugh |
| 9,193,587 B2 | 11/2015 | Bennett et al. |
| 9,195,075 B2 | 11/2015 | Pugh et al. |
| 9,225,375 B2 | 12/2015 | Pugh et al. |
| 9,388,048 B1 | 7/2016 | Zhou et al. |
| 9,425,709 B2 | 8/2016 | Hayashi et al. |
| 9,463,421 B2 | 10/2016 | Fleming |
| 9,475,709 B2 | 10/2016 | Stetson et al. |
| 9,505,192 B2 | 11/2016 | Stoltenberg et al. |
| 9,567,224 B2 | 2/2017 | Bedworth |
| 9,572,918 B2 | 2/2017 | Bachmann et al. |
| 9,592,475 B2 | 3/2017 | Stoltenberg et al. |
| 9,610,546 B2 | 4/2017 | Sinton et al. |
| 2001/0036556 A1 | 11/2001 | Jen |
| 2001/0047157 A1 | 11/2001 | Burnett et al. |
| 2001/0055597 A1 | 12/2001 | Liu et al. |
| 2002/0079004 A1* | 6/2002 | Sato .................. F16K 11/044 137/625.65 |
| 2002/0079054 A1* | 6/2002 | Nakatani ............. B82Y 25/00 156/345.1 |
| 2002/0104435 A1 | 8/2002 | Baker et al. |
| 2002/0115957 A1 | 8/2002 | Sun et al. |
| 2002/0183682 A1 | 12/2002 | Darvish et al. |
| 2002/0183686 A1 | 12/2002 | Darvish et al. |
| 2003/0052354 A1 | 3/2003 | Dennison |
| 2003/0134281 A1 | 7/2003 | Evans |
| 2003/0138777 A1 | 7/2003 | Evans |
| 2003/0146221 A1 | 8/2003 | Lauer et al. |
| 2003/0159985 A1 | 8/2003 | Siwy et al. |
| 2004/0061253 A1 | 4/2004 | Kleinmeyer et al. |
| 2004/0063097 A1 | 4/2004 | Evans |
| 2004/0099324 A1 | 5/2004 | Fraser et al. |
| 2004/0111968 A1 | 6/2004 | Day et al. |
| 2004/0112865 A1 | 6/2004 | McCullough et al. |
| 2004/0121488 A1 | 6/2004 | Chang et al. |
| 2004/0142463 A1 | 7/2004 | Walker et al. |
| 2004/0185730 A1 | 9/2004 | Lambino et al. |
| 2004/0193043 A1 | 9/2004 | Duchon et al. |
| 2004/0199243 A1 | 10/2004 | Yodfat |
| 2004/0217036 A1 | 11/2004 | Ginsberg et al. |
| 2004/0241214 A1 | 12/2004 | Kirkwood et al. |
| 2004/0251136 A1 | 12/2004 | Lean et al. |
| 2005/0004508 A1 | 1/2005 | Sun et al. |
| 2005/0004509 A1 | 1/2005 | Sun et al. |
| 2005/0004550 A1 | 1/2005 | Sun et al. |
| 2005/0010161 A1 | 1/2005 | Sun et al. |
| 2005/0010192 A1 | 1/2005 | Sun et al. |
| 2005/0015042 A1 | 1/2005 | Sun et al. |
| 2005/0053563 A1 | 3/2005 | Manissier et al. |
| 2005/0112078 A1 | 5/2005 | Boddupalli et al. |
| 2005/0126966 A1 | 6/2005 | Tanida et al. |
| 2005/0129633 A1 | 6/2005 | Lin |
| 2005/0148996 A1 | 7/2005 | Sun et al. |
| 2005/0170089 A1 | 8/2005 | Lashmore et al. |
| 2005/0189673 A1 | 9/2005 | Klug et al. |
| 2005/0226834 A1 | 10/2005 | Lambino et al. |
| 2005/0238730 A1 | 10/2005 | Le Fur et al. |
| 2006/0005381 A1 | 1/2006 | Nishi et al. |
| 2006/0036332 A1 | 2/2006 | Jennings |
| 2006/0073370 A1 | 4/2006 | Krusic et al. |
| 2006/0093885 A1 | 5/2006 | Krusic et al. |
| 2006/0121279 A1 | 6/2006 | Petrik |
| 2006/0151382 A1 | 7/2006 | Petrik |
| 2006/0166347 A1 | 7/2006 | Faulstich et al. |
| 2006/0180604 A1 | 8/2006 | Ginsberg et al. |
| 2006/0222701 A1 | 10/2006 | Kulkarni et al. |
| 2006/0253078 A1 | 11/2006 | Wu et al. |
| 2007/0004640 A1 | 1/2007 | Lin et al. |
| 2007/0032054 A1 | 2/2007 | Ramaswamy et al. |
| 2007/0056894 A1 | 3/2007 | Connors, Jr. |
| 2007/0060862 A1 | 3/2007 | Sun et al. |
| 2007/0062856 A1 | 3/2007 | Pahl et al. |
| 2007/0099813 A1 | 5/2007 | Luizzi et al. |
| 2007/0131646 A1 | 6/2007 | Donnelly et al. |
| 2007/0284279 A1 | 12/2007 | Doskoczynski et al. |
| 2008/0017564 A1 | 1/2008 | Hammond |
| 2008/0035484 A1 | 2/2008 | Wu et al. |
| 2008/0035541 A1 | 2/2008 | Franzreb et al. |
| 2008/0045877 A1 | 2/2008 | Levin et al. |
| 2008/0061477 A1 | 3/2008 | Capizzo |
| 2008/0063585 A1 | 3/2008 | Smalley et al. |
| 2008/0081323 A1 | 4/2008 | Keeley et al. |
| 2008/0081362 A1 | 4/2008 | Keeley et al. |
| 2008/0149561 A1 | 6/2008 | Chu et al. |
| 2008/0156648 A1 | 7/2008 | Dudziak et al. |
| 2008/0170982 A1 | 7/2008 | Zhang et al. |
| 2008/0185293 A1 | 8/2008 | Klose et al. |
| 2008/0188836 A1 | 8/2008 | Weber et al. |
| 2008/0190508 A1 | 8/2008 | Booth et al. |
| 2008/0241085 A1 | 10/2008 | Lin et al. |
| 2008/0268016 A1 | 10/2008 | Fang et al. |

(56) References Cited

U.S. PATENT DOCUMENTS

| | | |
|---|---|---|
| 2008/0290020 A1 | 11/2008 | Marand et al. |
| 2008/0290111 A1 | 11/2008 | Ginsberg et al. |
| 2009/0023572 A1 | 1/2009 | Backes et al. |
| 2009/0039019 A1 | 2/2009 | Raman |
| 2009/0048685 A1 | 2/2009 | Frigstad et al. |
| 2009/0075371 A1 | 3/2009 | Keeley et al. |
| 2009/0087395 A1 | 4/2009 | Lin et al. |
| 2009/0117335 A1 | 5/2009 | Iyoda et al. |
| 2009/0148495 A1 | 6/2009 | Hammer et al. |
| 2009/0176159 A1 | 7/2009 | Zhamu et al. |
| 2009/0222072 A1 | 9/2009 | Robinson et al. |
| 2009/0236295 A1 | 9/2009 | Braun et al. |
| 2009/0241242 A1 | 10/2009 | Beatty et al. |
| 2009/0283475 A1 | 11/2009 | Hylton et al. |
| 2009/0291270 A1 | 11/2009 | Zettl et al. |
| 2009/0294300 A1 | 12/2009 | Kanzius et al. |
| 2009/0306364 A1 | 12/2009 | Beer et al. |
| 2010/0000754 A1 | 1/2010 | Mann et al. |
| 2010/0016778 A1 | 1/2010 | Chattopadhyay |
| 2010/0021708 A1 | 1/2010 | Kong et al. |
| 2010/0024722 A1 | 2/2010 | Ochs et al. |
| 2010/0024838 A1 | 2/2010 | Ochs et al. |
| 2010/0025330 A1 | 2/2010 | Ratto et al. |
| 2010/0055464 A1 | 3/2010 | Sung |
| 2010/0059378 A1 | 3/2010 | Elson et al. |
| 2010/0072643 A1 | 3/2010 | Pugh et al. |
| 2010/0076553 A1 | 3/2010 | Pugh et al. |
| 2010/0105834 A1 | 4/2010 | Tour et al. |
| 2010/0110372 A1 | 5/2010 | Pugh et al. |
| 2010/0124564 A1 | 5/2010 | Martinson et al. |
| 2010/0127312 A1 | 5/2010 | Grebel et al. |
| 2010/0161014 A1 | 6/2010 | Lynch et al. |
| 2010/0167551 A1 | 7/2010 | Dedontney |
| 2010/0196439 A1 | 8/2010 | Beck et al. |
| 2010/0209515 A1 | 8/2010 | Chantalat et al. |
| 2010/0213079 A1 | 8/2010 | Willis |
| 2010/0224555 A1 | 9/2010 | Hoek et al. |
| 2010/0228204 A1 | 9/2010 | Beatty et al. |
| 2010/0233781 A1 | 9/2010 | Bangera et al. |
| 2010/0249273 A1 | 9/2010 | Scales et al. |
| 2010/0258111 A1 | 10/2010 | Shah et al. |
| 2010/0323177 A1 | 12/2010 | Ruoff et al. |
| 2010/0327847 A1 | 12/2010 | Leiber et al. |
| 2011/0014217 A1 | 1/2011 | Fahmy et al. |
| 2011/0037033 A1 | 2/2011 | Green et al. |
| 2011/0041519 A1 | 2/2011 | McAlister |
| 2011/0041687 A1 | 2/2011 | Diaz et al. |
| 2011/0045523 A1 | 2/2011 | Strano et al. |
| 2011/0054418 A1 | 3/2011 | Pugh et al. |
| 2011/0054576 A1 | 3/2011 | Robinson et al. |
| 2011/0056892 A1 | 3/2011 | Lancaster |
| 2011/0073563 A1 | 3/2011 | Chang et al. |
| 2011/0092949 A1 | 4/2011 | Wang |
| 2011/0100921 A1 | 5/2011 | Heinrich |
| 2011/0112484 A1 | 5/2011 | Carter et al. |
| 2011/0118655 A1 | 5/2011 | Fassih et al. |
| 2011/0120970 A1 | 5/2011 | Joo et al. |
| 2011/0124253 A1 | 5/2011 | Shah et al. |
| 2011/0139707 A1 | 6/2011 | Siwy et al. |
| 2011/0152795 A1 | 6/2011 | Aledo et al. |
| 2011/0201201 A1 | 8/2011 | Arnold et al. |
| 2011/0202201 A1 | 8/2011 | Matsubara |
| 2011/0253630 A1 | 10/2011 | Bakajin et al. |
| 2011/0258791 A1 | 10/2011 | Batchvarova et al. |
| 2011/0258796 A1 | 10/2011 | Batchvarova et al. |
| 2011/0262645 A1 | 10/2011 | Batchvarova et al. |
| 2011/0263912 A1 | 10/2011 | Miller et al. |
| 2011/0269920 A1 | 11/2011 | Min et al. |
| 2012/0031833 A1 | 2/2012 | Ho et al. |
| 2012/0048804 A1 | 3/2012 | Stetson et al. |
| 2012/0116228 A1 | 5/2012 | Okubo |
| 2012/0145548 A1 | 6/2012 | Sivan et al. |
| 2012/0148633 A1 | 6/2012 | Sun et al. |
| 2012/0162600 A1 | 6/2012 | Pugh et al. |
| 2012/0183738 A1 | 7/2012 | Zettl et al. |
| 2012/0186850 A1 | 7/2012 | Sugiyama et al. |
| 2012/0211367 A1 | 8/2012 | Vecitis |
| 2012/0218508 A1 | 8/2012 | Pugh et al. |
| 2012/0220053 A1 | 8/2012 | Lee et al. |
| 2012/0234453 A1 | 9/2012 | Pugh et al. |
| 2012/0234679 A1 | 9/2012 | Garaj et al. |
| 2012/0235277 A1 | 9/2012 | Pugh et al. |
| 2012/0236254 A1 | 9/2012 | Pugh et al. |
| 2012/0236524 A1 | 9/2012 | Pugh et al. |
| 2012/0241371 A1 | 9/2012 | Revanur et al. |
| 2012/0242953 A1 | 9/2012 | Pugh et al. |
| 2012/0255899 A1 | 10/2012 | Choi et al. |
| 2012/0267337 A1 | 10/2012 | Striemer et al. |
| 2012/0292245 A1 | 11/2012 | Saito |
| 2012/0298396 A1 | 11/2012 | Hong et al. |
| 2013/0015136 A1 | 1/2013 | Bennett et al. |
| 2013/0034760 A1 | 2/2013 | Otts et al. |
| 2013/0045523 A1 | 2/2013 | Leach et al. |
| 2013/0056367 A1 | 3/2013 | Martinez et al. |
| 2013/0071941 A1 | 3/2013 | Miller |
| 2013/0096292 A1 | 4/2013 | Brahmasandra et al. |
| 2013/0100436 A1 | 4/2013 | Jackson et al. |
| 2013/0105417 A1 | 5/2013 | Stetson et al. |
| 2013/0116541 A1 | 5/2013 | Gracias et al. |
| 2013/0131214 A1 | 5/2013 | Scales et al. |
| 2013/0135578 A1 | 5/2013 | Pugh et al. |
| 2013/0146221 A1 | 6/2013 | Kolmakov et al. |
| 2013/0146480 A1 | 6/2013 | Garaj et al. |
| 2013/0152386 A1 | 6/2013 | Pandojirao-S et al. |
| 2013/0174978 A1 | 7/2013 | Pugh et al. |
| 2013/0190476 A1 | 7/2013 | Lancaster et al. |
| 2013/0192460 A1 | 8/2013 | Miller et al. |
| 2013/0192461 A1 | 8/2013 | Miller et al. |
| 2013/0194540 A1 | 8/2013 | Pugh et al. |
| 2013/0213568 A1 | 8/2013 | Pugh et al. |
| 2013/0215377 A1 | 8/2013 | Pugh et al. |
| 2013/0215378 A1 | 8/2013 | Pugh et al. |
| 2013/0215380 A1 | 8/2013 | Pugh et al. |
| 2013/0216581 A1 | 8/2013 | Fahmy et al. |
| 2013/0240355 A1 | 9/2013 | Ho et al. |
| 2013/0240437 A1 | 9/2013 | Rodrigues et al. |
| 2013/0248097 A1 | 9/2013 | Ploss, Jr. |
| 2013/0248367 A1 | 9/2013 | Stetson et al. |
| 2013/0249147 A1 | 9/2013 | Bedworth |
| 2013/0256118 A1 | 10/2013 | Meller et al. |
| 2013/0256139 A1 | 10/2013 | Peng |
| 2013/0256154 A1 | 10/2013 | Peng |
| 2013/0256210 A1 | 10/2013 | Fleming |
| 2013/0256211 A1 | 10/2013 | Fleming |
| 2013/0261568 A1 | 10/2013 | Martinson et al. |
| 2013/0269819 A1 | 10/2013 | Ruby et al. |
| 2013/0270188 A1* | 10/2013 | Karnik .............. B01D 53/228 210/650 |
| 2013/0273288 A1 | 10/2013 | Luo et al. |
| 2013/0277305 A1 | 10/2013 | Stetson et al. |
| 2013/0295150 A1 | 11/2013 | Chantalat et al. |
| 2013/0309776 A1 | 11/2013 | Drndic et al. |
| 2013/0317131 A1 | 11/2013 | Scales et al. |
| 2013/0317132 A1 | 11/2013 | Scales et al. |
| 2013/0317133 A1 | 11/2013 | Scales et al. |
| 2013/0323295 A1 | 12/2013 | Scales et al. |
| 2013/0338611 A1 | 12/2013 | Pugh et al. |
| 2013/0338744 A1 | 12/2013 | Frewin et al. |
| 2014/0002788 A1 | 1/2014 | Otts et al. |
| 2014/0005514 A1 | 1/2014 | Pugh et al. |
| 2014/0015160 A1 | 1/2014 | Kung et al. |
| 2014/0017322 A1 | 1/2014 | Dai et al. |
| 2014/0066958 A1 | 3/2014 | Priewe |
| 2014/0079936 A1 | 3/2014 | Russo et al. |
| 2014/0093728 A1 | 4/2014 | Shah et al. |
| 2014/0128891 A1 | 5/2014 | Astani-Matthies et al. |
| 2014/0141521 A1 | 5/2014 | Peng et al. |
| 2014/0151288 A1 | 6/2014 | Miller et al. |
| 2014/0151631 A1 | 6/2014 | Duesberg et al. |
| 2014/0154464 A1 | 6/2014 | Miller et al. |
| 2014/0170195 A1 | 6/2014 | Fassih et al. |
| 2014/0171541 A1 | 6/2014 | Scales et al. |
| 2014/0174927 A1 | 6/2014 | Bashir et al. |
| 2014/0190004 A1 | 7/2014 | Riall et al. |

(56) References Cited

U.S. PATENT DOCUMENTS

| | | |
|---|---|---|
| 2014/0190550 A1 | 7/2014 | Loh et al. |
| 2014/0190676 A1 | 7/2014 | Zhamu et al. |
| 2014/0192313 A1 | 7/2014 | Riall et al. |
| 2014/0192314 A1 | 7/2014 | Riall et al. |
| 2014/0199777 A2 | 7/2014 | Ruiz et al. |
| 2014/0209539 A1 | 7/2014 | El Badawi et al. |
| 2014/0212596 A1 | 7/2014 | Jahangiri-Famenini |
| 2014/0230653 A1 | 8/2014 | Yu et al. |
| 2014/0230733 A1 | 8/2014 | Miller |
| 2014/0231351 A1 | 8/2014 | Wickramasinghe et al. |
| 2014/0248621 A1 | 9/2014 | Collins |
| 2014/0257348 A1 | 9/2014 | Priewe et al. |
| 2014/0257517 A1 | 9/2014 | Deichmann et al. |
| 2014/0259657 A1 | 9/2014 | Riall et al. |
| 2014/0261999 A1 | 9/2014 | Stetson et al. |
| 2014/0263035 A1 | 9/2014 | Stoltenberg et al. |
| 2014/0263178 A1 | 9/2014 | Sinton et al. |
| 2014/0264977 A1 | 9/2014 | Pugh et al. |
| 2014/0268015 A1 | 9/2014 | Riall et al. |
| 2014/0268020 A1 | 9/2014 | Pugh et al. |
| 2014/0268021 A1 | 9/2014 | Pugh et al. |
| 2014/0268026 A1 | 9/2014 | Pugh et al. |
| 2014/0272286 A1 | 9/2014 | Stoltenberg et al. |
| 2014/0272522 A1 | 9/2014 | Pugh et al. |
| 2014/0273315 A1 | 9/2014 | Pugh et al. |
| 2014/0273316 A1 | 9/2014 | Pugh et al. |
| 2014/0276481 A1 | 9/2014 | Pugh et al. |
| 2014/0276999 A1 | 9/2014 | Harms et al. |
| 2014/0306361 A1 | 10/2014 | Pugh et al. |
| 2014/0308681 A1 | 10/2014 | Strano et al. |
| 2014/0315213 A1 | 10/2014 | Nagrath et al. |
| 2014/0318373 A1 | 10/2014 | Wood et al. |
| 2014/0322518 A1 | 10/2014 | Addleman et al. |
| 2014/0333892 A1 | 11/2014 | Pugh et al. |
| 2014/0335661 A1 | 11/2014 | Pugh et al. |
| 2014/0343580 A1 | 11/2014 | Priewe |
| 2014/0346081 A1 | 11/2014 | Sowden et al. |
| 2014/0349892 A1 | 11/2014 | Van Der Zaag et al. |
| 2014/0350372 A1 | 11/2014 | Pugh et al. |
| 2014/0377651 A1 | 12/2014 | Kwon et al. |
| 2014/0377738 A1 | 12/2014 | Bachmann et al. |
| 2015/0015843 A1 | 1/2015 | Pugh et al. |
| 2015/0017918 A1 | 1/2015 | Pugh et al. |
| 2015/0057762 A1 | 2/2015 | Harms et al. |
| 2015/0061990 A1 | 3/2015 | Toner et al. |
| 2015/0062533 A1 | 3/2015 | Toner et al. |
| 2015/0063605 A1 | 3/2015 | Pugh |
| 2015/0066063 A1 | 3/2015 | Priewe |
| 2015/0075667 A1 | 3/2015 | McHugh et al. |
| 2015/0077658 A1 | 3/2015 | Pugh et al. |
| 2015/0077659 A1 | 3/2015 | Pugh et al. |
| 2015/0077660 A1 | 3/2015 | Pugh et al. |
| 2015/0077661 A1 | 3/2015 | Pugh et al. |
| 2015/0077662 A1 | 3/2015 | Pugh et al. |
| 2015/0077663 A1 | 3/2015 | Pugh et al. |
| 2015/0077699 A1 | 3/2015 | De Sio et al. |
| 2015/0077702 A9 | 3/2015 | Pugh et al. |
| 2015/0079683 A1 | 3/2015 | Yager et al. |
| 2015/0087249 A1 | 3/2015 | Pugh et al. |
| 2015/0096935 A1 | 4/2015 | Mitra et al. |
| 2015/0098910 A1 | 4/2015 | Mordas et al. |
| 2015/0101931 A1 | 4/2015 | Garaj et al. |
| 2015/0105686 A1 | 4/2015 | Vasan |
| 2015/0118318 A1 | 4/2015 | Fahmy et al. |
| 2015/0122727 A1 | 5/2015 | Karnik et al. |
| 2015/0138454 A1 | 5/2015 | Pugh et al. |
| 2015/0142107 A1 | 5/2015 | Pugh et al. |
| 2015/0145155 A1 | 5/2015 | Pugh et al. |
| 2015/0146162 A1 | 5/2015 | Pugh et al. |
| 2015/0147474 A1 | 5/2015 | Batchvarova et al. |
| 2015/0170788 A1 | 6/2015 | Miller et al. |
| 2015/0174253 A1 | 6/2015 | Sun et al. |
| 2015/0174254 A1 | 6/2015 | Sun et al. |
| 2015/0182473 A1 | 7/2015 | Bosnyak et al. |
| 2015/0185180 A1 | 7/2015 | Ruhl et al. |
| 2015/0196579 A1 | 7/2015 | Ferrante et al. |
| 2015/0202351 A1 | 7/2015 | Kaplan et al. |
| 2015/0212339 A1 | 7/2015 | Pugh et al. |
| 2015/0217219 A1 | 8/2015 | Sinsabaugh et al. |
| 2015/0218210 A1 | 8/2015 | Stetson et al. |
| 2015/0221474 A1* | 8/2015 | Bedworth ............... H01J 37/31 250/251 |
| 2015/0231557 A1 | 8/2015 | Miller et al. |
| 2015/0231577 A1 | 8/2015 | Nair et al. |
| 2015/0247178 A1 | 9/2015 | Mountcastle et al. |
| 2015/0258254 A1* | 9/2015 | Simon ................ A61K 9/0024 424/443 |
| 2015/0258498 A1 | 9/2015 | Simon et al. |
| 2015/0258502 A1 | 9/2015 | Turowski et al. |
| 2015/0258503 A1* | 9/2015 | Sinton ................... B01D 69/12 95/49 |
| 2015/0258525 A1 | 9/2015 | Westman et al. |
| 2015/0268150 A1 | 9/2015 | Newkirk et al. |
| 2015/0272834 A1 | 10/2015 | Sun et al. |
| 2015/0272896 A1 | 10/2015 | Sun et al. |
| 2015/0273401 A1 | 10/2015 | Miller et al. |
| 2015/0309337 A1 | 10/2015 | Flitsch et al. |
| 2015/0321147 A1 | 11/2015 | Fleming et al. |
| 2015/0321149 A1 | 11/2015 | McGinnis |
| 2015/0323811 A1 | 11/2015 | Flitsch et al. |
| 2015/0336202 A1* | 11/2015 | Bedworth ............... H01J 37/31 428/137 |
| 2015/0342900 A1 | 12/2015 | Putnins |
| 2015/0346382 A1 | 12/2015 | Bliven et al. |
| 2015/0351887 A1 | 12/2015 | Peters |
| 2015/0359742 A1 | 12/2015 | Fassih et al. |
| 2015/0378176 A1 | 12/2015 | Flitsch et al. |
| 2016/0009049 A1 | 1/2016 | Stoltenberg et al. |
| 2016/0038885 A1 | 2/2016 | Hogen-Esch et al. |
| 2016/0043384 A1 | 2/2016 | Zhamu et al. |
| 2016/0058932 A1 | 3/2016 | Stetson et al. |
| 2016/0059190 A1 | 3/2016 | Yoo et al. |
| 2016/0067390 A1 | 3/2016 | Simon et al. |
| 2016/0074814 A1 | 3/2016 | Park et al. |
| 2016/0074815 A1* | 3/2016 | Sinton ................... B01D 69/02 95/49 |
| 2016/0272499 A1 | 9/2016 | Graphenea |
| 2016/0282326 A1 | 9/2016 | Waduge et al. |
| 2016/0284811 A1 | 9/2016 | Yu et al. |
| 2016/0339160 A1* | 11/2016 | Bedworth ........... A61M 1/1623 |
| 2017/0032962 A1 | 2/2017 | Graphenea |
| 2017/0037356 A1 | 2/2017 | Simon et al. |
| 2017/0057812 A1 | 3/2017 | Graphenea |

FOREIGN PATENT DOCUMENTS

| | | |
|---|---|---|
| CN | 1128501 A | 8/1996 |
| CN | 101108194 A | 1/2008 |
| CN | 101243544 | 8/2008 |
| CN | 101428198 A | 5/2009 |
| CN | 101489653 A | 7/2009 |
| CN | 101996853 A | 3/2011 |
| CN | 102242062 A | 11/2011 |
| CN | 102344132 | 2/2012 |
| CN | 102423272 | 4/2012 |
| CN | 102592720 A | 7/2012 |
| CN | 101996853 B | 8/2012 |
| CN | 102637584 A | 8/2012 |
| CN | 103153441 | 6/2013 |
| CN | 103182249 A | 7/2013 |
| CN | 103603706 A | 2/2014 |
| DE | 19536560 | 3/1997 |
| DE | 10 2005 049 388 A1 | 4/2007 |
| EP | 0 364 628 A1 | 4/1990 |
| EP | 1 034 251 | 1/2004 |
| EP | 1 777 250 A1 | 4/2007 |
| EP | 1 872 812 | 1/2008 |
| EP | 2 060 286 | 5/2009 |
| EP | 2 107 120 A1 | 10/2009 |
| EP | 2 230 511 A1 | 9/2010 |
| EP | 1 603 609 | 5/2011 |
| EP | 2 354 272 | 8/2011 |
| EP | 2 450 096 | 5/2012 |

(56) References Cited

FOREIGN PATENT DOCUMENTS

| | | |
|---|---|---|
| EP | 2 489 520 | 8/2012 |
| EP | 2 511 002 | 10/2012 |
| EP | 2 586 473 | 5/2013 |
| EP | 2 679 540 | 1/2014 |
| EP | 2 937 313 | 10/2015 |
| EP | 3 070 053 | 9/2016 |
| EP | 3 084 398 | 10/2016 |
| EP | 1 538 2430 | 3/2017 |
| EP | 3 135 631 | 3/2017 |
| JP | 59-102111 | 7/1984 |
| JP | 10-510471 | 5/1995 |
| JP | 7504120 | 5/1995 |
| JP | 2001-232158 | 8/2001 |
| JP | 2004-179014 | 6/2004 |
| JP | 2005-126966 | 5/2005 |
| JP | 2006-188393 | 7/2006 |
| JP | 2011-168448 A | 9/2011 |
| JP | 2011-241479 | 12/2011 |
| JP | 2004-202480 | 7/2014 |
| JP | 2015-503405 | 2/2015 |
| JP | 2016-175828 | 10/2016 |
| KR | 1020110084110 | 7/2011 |
| KR | 10-2012-0022164 A | 3/2012 |
| KR | 1020120022164 A | 3/2012 |
| KR | 1020140002570 | 1/2014 |
| WO | WO-93/33901 | 3/1993 |
| WO | WO-93/12859 | 8/1993 |
| WO | WO-95/00231 | 1/1995 |
| WO | WO-97/12664 A1 | 4/1997 |
| WO | WO-98/30501 A2 | 7/1998 |
| WO | WO-00/70012 | 11/2000 |
| WO | WO-02/055539 A1 | 7/2002 |
| WO | WO-2013/115762 | 8/2003 |
| WO | WO-2004/009840 A1 | 1/2004 |
| WO | WO-2004/082733 | 9/2004 |
| WO | WO-2005/047857 A2 | 5/2005 |
| WO | WO-2007/103411 A2 | 9/2007 |
| WO | WO 2007/140252 A1 | 12/2007 |
| WO | WO-2008/008533 | 1/2008 |
| WO | WO-2009/129984 A1 | 10/2009 |
| WO | WO-2010/006080 | 1/2010 |
| WO | WO-2010/115904 A1 | 10/2010 |
| WO | WO-2011/019686 A1 | 2/2011 |
| WO | WO-2011/046706 A1 | 4/2011 |
| WO | WO-2011/001674 | 6/2011 |
| WO | WO-2011/063458 A1 | 6/2011 |
| WO | WO-2011/075158 | 6/2011 |
| WO | WO 2011/094204 A2 | 8/2011 |
| WO | WO-2011/100458 A2 | 8/2011 |
| WO | WO-2011/138689 A2 | 11/2011 |
| WO | WO-2012/006657 A1 | 1/2012 |
| WO | WO-2012/021801 A2 | 2/2012 |
| WO | WO-2012/027148 A1 | 3/2012 |
| WO | WO-2012/028695 | 3/2012 |
| WO | WO-2012/030368 A1 | 3/2012 |
| WO | WO-2012/125770 | 9/2012 |
| WO | WO-2012/138671 A2 | 10/2012 |
| WO | WO-2012/142852 A1 | 10/2012 |
| WO | WO-2013/016445 A1 | 1/2013 |
| WO | WO-2013/048063 A1 | 4/2013 |
| WO | WO-2013/138137 A1 | 9/2013 |
| WO | WO 2013/138698 A1 | 9/2013 |
| WO | WO-2013/151799 | 10/2013 |
| WO | WO-2013/152179 A1 | 10/2013 |
| WO | WO-2014/084861 A1 | 6/2014 |
| WO | WO-2014/168629 A1 | 10/2014 |
| WO | WO-2015/030698 A1 | 3/2015 |
| WO | WO-2015/138736 A1 | 9/2015 |
| WO | WO-2015/138752 A1 | 9/2015 |
| WO | WO-2015/1138771 A1 | 9/2015 |
| WO | WO-2015/197217 | 12/2015 |
| WO | WO-2016/102003 | 6/2016 |

OTHER PUBLICATIONS

AMI Applied Membranes Inc., Filmtec Nanofiltration Membrane Elements, <<appliedmembranes.com/nanofiltration_elements.htm>>, accessed Apr. 28, 2015.
Apel (Jun. 2001), "Track etching technique in membrane technology"; Radiation Measurements, Elsevier, Amsterdam, vol. 34, No. 1-6; Jun. 1, 2001; pp. 559-566.
Bai (Jingwei) et al. (Feb. 2010), "Graphene nanomesh"; Nature Nanotechnology; Feb. 14, 2010; whole document.
Baker (Apr. 2004), "Membrane Technology and Applications"; Membrane Technology and Applications; Apr. 14, 2004; pp. 92-94.
Childres et al. (Feb. 2011), "Effect of oxygen plasma etching on graphene studied using Raman spectroscopy and electronic transport measurements"; New Journal of Physics; Feb. 2011, vol. 13.
Clochard, "Track-etched polymer membranes," Ecole Polytechnique, <<lsi.polytechnique.fr/home/research/physics-and-chemistry-of-nano-objects/track-etched-polymer-membranes-97035.kjsp>> Accessed Jul. 30, 2015.
Cohen-Tanugi et al. (2012), "Water Desalination across Nanoporous Graphene", ACS Publications; MIT; 2012 dx.doi.org/10.1021/nl3012853 | Nano Lett. 2012, 12(7), pp. 3602-3608.
Fischbein et al. (Sep. 2008), "Electron beam nanosculpting of suspended graphene sheets"; Applied Physics Letters; American Institute of Physics; vol. 93, No. II; Sep. 16, 2008.
Galashev (Nov. 2014), "Computer study of the removal of Cu from the graphene surface using Ar clusters." Computational Materials Science 98 (2015): 123-128.
International Search Report and Written Opinion mailed Apr. 30, 2015, corresponding to International Patent Application No. PCT/US15/13805.
Inui et al. (Dec. 2009), "Molecular dynamics simulations of nanopore processing in a graphene sheet by using gas cluster ion beam," Appl Phys A (2010) 98: 787-794.
Jiang et al. (Dec. 2009), "Porous graphene as the ultimate membrane for gas separation"; Nano Letters; America! Chemical Society, USA; Dec. 9, 2009; vol. 9, No. 12; pp. 4019-4024.
Karan et al. (Jan. 2012), "Ultrafast Viscous Permeation of Organic Solvents Through Diamond-Like Carbon Nanosheets"; Science Magazine; vol. 33S; Jan. 27, 2012.
Kim et al. (Mar. 2010), "Fabrication and Characterization of Large-Area, Semiconducting Nanoperforated Graphene Materials," DOI: 10.1021/nl9032318 | Nano Lett 2010, 10 (4), pp. 1125-1131.
Kim et al. (Sep. 2009), "The structural and electrical evolution ofgraphene by oxygen plasma induced disorder"; Nanotechnology IOP Publishing Ltd, UK; vol. 20, No. 37; Sep. 16, 2009.
Lehtinen et al. (Feb. 2011), "Cutting and controlled modification of graphene with ion beams," Nanotechnology 22 175306.
Liu et al. (Jun. 2008), "Graphene Oxidation: Thickness-Dependent Etching and Strong Chemical Doping," Nano Lett. 2008, vol. 8, No. 7, p. 1965-1970.
Liu et al. (Mar. 2014), "Atomically Thin Molybdenum Disulfide Nanopores with High Sensitivity for DNA Translocation"; ACS Nano; vol. 8, No. 3; Mar. 25, 2014; pp. 2504-2511.
Morse (Apr. 2010), "Scalable Synthesis of Semiconducting Nanopatterned Graphene Materials"; InterNano Resources for Nanomanufacturing; Apr. 30, 2010.
O'Hern et al. (Mar. 2014), "Selective Ionic Transport through Tunable Subnanometer Pores in Single-Layer Graphene Membranes." NanoLetters. DOI: 10.1021/nl404118f Nano Lett. 14, No. 3: 1234-1241.
O'Hern et al. (Sep. 2011), "Development of process to transfer large areas of LPCVD graphene from copper foil to a porous support substrate," Massachusetts Institute of Technology, Thesis, pp. 1-62.
Plant et al. (Oct. 2013), "Size-dependent propagation of Au nanoclusters through few-layer graphene," Nanoscale, DOI: 10.1039/c3nr04770a.
Popok, Vladimir. "Cluster Ion Implantation in Graphite and Diamond: Radiation Damage and Stopping of Cluster Constituents." Reviews on Advanced Materials Science 38(1), pp. 7-16.

(56) References Cited

OTHER PUBLICATIONS

Russo et al. (Apr. 2012), "Atom-by-atom nucleation and growth of graphene nanopores," PNAS | Apr. 17, 2012 | vol. 109 | No. 16 | 5953-5957.
Vlassiouk et al. (Dec. 2009), "Versatile ultrathin nanoporous silicon nitride membranes"; Proceedings of the National Academy Of Sciences; National Academy of Sciences; vol. 106, No. 50; Dec. 15, 2009; pp. 21039-21044.
Wadvalla (2012), "Boosting agriculture through seawater," Nature Middle East, doi:10.1038/nmiddleeast.2012.92 <<natureasia.com/en/nmiddleeast/article/10.1038/nmiddleeast.2012.92?WT.mc_id=FBK_NatureMEast>> Accessed Jul. 30, 2015.
Wikipedia, "Ion track" <<en.wikipedia.org/wiki/Ion_track>> Accessed Jul. 30, 2015.
Zabihi et al. (Jan. 2015), "Formation of nanopore in a suspended graphene sheet with argon cluster bombardment: A molecular dynamics simulation study." Nuclear Instruments and Methods in Physics Research Section B: Beam Interactions with Materials and Atoms 343 (2015): 48-51.
Zan et al. (2012), "Graphene Reknits Its Holes", Nano Lett., 2012, 12 (8), pp. 3936-3940.
Zhang et al. (Mar. 2011), "Method for anisotropic etching of graphite or graphene"; Institute of Physics, Chinese Academy of Sciences; PEOP. Rep. China; Mar. 30, 2011.
Zhao et al. (2012), "Effect of $SiO_2$ substrate on the irradiation-assisted manipulation of supported graphene: a molecular dynamics study," Nanotechnology 23 285703.
Zhao et al. (May 2012), "Drilling Nanopores in Graphene with Clusters: A Molecular Dynamics Study," J. Phys. Chem. C 2012, 116, 11776-11782.
Notice of Allowance for U.S. Appl. No. 14/819,273 dated Oct. 28, 2016.
U.S. Office Action for U.S. Appl. No. 14/193,007 dated Oct. 21, 2016.
U.S. Office Action for U.S. Appl. No. 14/193,007 dated Dec. 21, 2015.
U.S. Office Action for U.S. Appl. No. 14/193,007 dated Jul. 1, 2016.
CN Office Action in Chinese Application No. 201380013988.9 dated Aug. 18, 2016 (English translation not readily available).
U.S. Notice of Allowance in U.S. Appl. No. 14/610,770 dated Aug. 12, 2016.
U.S. Office Action in U.S. Appl. No. 14/656,190 dated Aug. 29, 2016.
U.S. Office Action for U.S. Appl. No. 14/656,580 dated Jun. 2, 2016.
U.S. Office Action in U.S. Appl. No. 14/819,273 dated Jul. 6, 2016.
U.S. Office Action for U.S. Appl. No. 14/856,198 dated Jun. 3, 2016.
Yoon, "Simulations show how to turn graphene's defects into assets," ScienceDaily (Oct. 4, 2016), www.sciencedaily.com/releases/2016/10/161004120428.htm.
Zhang et al. Modern Thin-Film Technology 284-285 (Metallurgical Industry Press, 1st ed. 2009) (English translation not readily available).
Adiga et al., "Nanoporous Materials for Biomedical Devices," JOM 60: 26-32 (Mar. 25, 2008).
Atmeh et al., "Albumin Aggregates: Hydrodynamic Shape and Physico-Chemical Properties," Jordan Journal of Chemistry, 2(2): 169-182 (2007).
Bae et al., "Roll-to-roll production of 30-inch graphene films for transparent electrodes," Nature Nanotechnology 5: 574-578 (Jun. 20, 2010).
Butler et al. "Progress, Challenges, and Opportunities in Two-Dimensional Materials Beyond Graphene", Materials Review 7(4): 2898-2926 (Mar. 6, 2013).
Chen et al., "Mechanically Strong, Electrically Conductive, and Biocompatible Graphene Paper," Adv. Mater., 20(18): 3557-3561 (Sep. 2008) (available online Jul. 2008).
Chhowalla et al., "The chemistry of two-dimensional layered transition metal dichalcogenide nanosheets," Nature Chemistry 5: 263-275 (Mar. 20, 2013).
Cohen-Tanugi, "Nanoporous graphene as a water desalination membrane," Thesis: Ph.D., Massachusetts Institute of Technology, Department of Materials Science and Engineering (Jun. 2015).
Colton, "Implantable biohybrid artificial organs," Cell Transplantation 4(4): 415-436 (Jul.-Aug. 1995).
Desai et al., "Nanoporous microsystems for islet cell replacement," Advanced Drug Delivery Reviews 56: 1661-1673 (Jul. 23, 2004).
Dong et al., "Growth of large-sized graphene thin-films by liquid precursor-based chemical vapor deposition under atmospheric pressure," Carbon 49(11): 3672-3678 (May 2011).
Fissell et al., "High-Performance Silicon Nanopore Hemofiltration Membranes," NIH-PA Author Manuscript, PMC, (Jan. 5, 2010), also published in J. Memb. Sci. 326(1): 58-63 (Jan. 5, 2009).
Fuertes et al., "Carbon composite membranes from Matrimid® and Kapton® polyimides for gas separation," Microporous and Mesoporous Materials, 33: 115-125 (Dec. 1999).
Gimi et al., "A Nanoporous, Transparent Microcontainer for Encapsulated Islet Therapy," J. Diabetes Sci. Tech. 3(2): 1-7 (Mar. 2009).
Hong et al., "Graphene multilayers as gates for multi-week sequential release of proteins from surfaces," NIH-PA Author Manuscript PMC (Jun. 1, 2014), also published in ACS Nano, Jan. 24, 2012; 6(1): 81-88 (first published online Dec. 29, 2011).
Hu et al., "Enabling graphene oxide nanosheets as water separation membranes," Environmental Science & Technology 47(8): 3715-3723 (Mar. 14, 2013).
International Search Report and Written Opinion in PCT/US2015/013599 dated Jul. 20, 2015.
International Search Report and Written Opinion in PCT/US2015/018114 dated Jun. 3, 2015.
International Search Report and Written Opinion in PCT/US2015/020246 dated Jun. 10, 2015.
International Search Report and Written Opinion in PCT/US2015/020296 dated Jun. 17, 2015.
International Search Report and Written Opinion in PCT/US2015/028948 dated Jul. 16, 2015.
International Search Report and Written Opinion in PCT/US2015/029932 dated Oct. 6, 2015.
International Search Report and Written Opinion in PCT/US2016/027607 dated Jul. 22, 2016.
International Search Report and Written Opinion in PCT/US2016/027616 dated Jul. 22, 2016.
International Search Report and Written Opinion in PCT/US2016/027596 dated Jul. 22, 2016.
International Search Report and Written Opinion in PCT/US2016/027603 dated Jul. 22, 2016.
International Search Report and Written Opinion in PCT/US2016/027610 dated Jul. 22, 2016.
International Search Report and Written Opinion in PCT/US2016/027612 dated Jul. 22, 2016.
International Search Report and Written Opinion in PCT/US2016/027637 dated Jun. 22, 2016.
International Search Report in PCT/US15/20201 dated Jun. 10, 2015.
International Search Report in PCT/US2015/048205 dated Dec. 4, 2015.
Joshi et al., "Precise and ultrafast molecular sieving through graphene oxide membranes", Science 343(6172): 752-754 (Feb. 14, 2014).
Kanani et al., "Permeability—Selectivity Analysis for Ultrafiltration: Effect of Pore Geometry," NIH-PA Author Manuscript, PMC, (Mar. 1, 2011), also published in J. Memb. Sci. 349(1-2): 405 (Mar. 1, 2010).
Karan et al., "Ultrafast Viscous Permeation of Organic Solvents Through Diamond-Like Carbon Nanosheets," Science 335: 444-447 (Jan. 27, 2012).
Koh et al., "Sensitive NMR Sensors Detect Antibodies to Influenza," NIH PA Author Manuscript PMC (Apr. 2009), also published in Angew. Chem. Int'l. Ed. Engl, 47(22): 4119-4121 (May 2008) (available online Apr. 2008).

(56) References Cited

OTHER PUBLICATIONS

Koski and Cui, "The New Skinny in Two-Dimensional Nanomaterials", ACS Nano 7(5): 3739-3743 (May 16, 2013).
Kurapati et al., "Graphene oxide based multilayer capsules with unique permeability properties: facile encapsulation of multiple drugs," Chemical Communication 48: 6013-6015 (Apr. 25, 2012).
Li et al., "3D graphene oxide-polymer hydrogel: near-infrared light-triggered active scaffold for reversible cell capture and on-demand release," Advanced Materials 25: 6737-6743 (Oct. 7, 2013).
Marquardt et al., "Hybrid materials of platinum nanoparticles and thiol-functionalized graphene derivatives," Carbon 66: 285-294 (Jan. 2014; first published online Sep. 12, 2013).
Matteucci et al., "Chapter 1: Transport of gases and Vapors in Glass and Rubbery Polymers," in Materials Science of Membranes for Gas and Vapor Separation (Yampolskii et al eds. 2006) (available online Jun. 2006).
Mishra et al., "Functionalized Graphene Sheets for Arsenic Removal and Desalination of Sea Water," Desalination 282: 39-45 (Nov. 1, 2011).
Nair et al., "Unimpeded Permeation of Water Through Helium-Leak-tight Graphene-Based Membranes," Science 335: 442-444 (Jan. 27, 2012).
Nam et al., "Monodispersed PtCo nanoparticles on hexadecyltrimethylammonium bromide treated graphene as an effective oxygen reduction reaction catalyst for proton exchange membrane fuel cells," Carbon 50: 3739-3747 (Aug. 2012) (available online Apr. 2012).
Nandamuri et al., "Chemical vapor deposition of graphene films," Nanotechnology 21(14): 1-4 (Mar. 10, 2010).
Nayini et al., "Synthesis and characterization of functionalized carbon nanotubes with different wetting behaviors and their influence on the wetting properties of carbon nanotubes/polymethylmethacrylate coatings," Progress in Organic Coatings, 77(6): 1007-1014 (Jun. 2014) (available online Mar. 2014).
O'Hern et al. "Selective Molecular Transport through Intrinsic Defects in a Single Layer of CVD Graphene," ACS Nano, 6(11): 10130-10138 (Oct. 2, 2012).
Paul, "Creating New Types of Carbon-Based Membranes," Science 335: 413-414 (Jan. 27, 2012).
Schweicher et al., "Membranes to achieve immunoprotection of transplanted islets," NIH-PA Author Manuscript, PMC, (Nov. 13, 2014), also published in Frontiers in Bioscience (Landmark Ed) 19: 49-76 (Jan. 1, 2014).
Sint et al., "Selective Ion Passage through Functionalized Graphene Nanopores," JACS 130: 1644816449 (Nov. 14, 2008).
Suk et al., "Water Transport Through Ultrathin Graphene," Journal of Physical Chemistry Letters 1(10): 1590-1594 (Apr. 30, 2010).
Sun et al., "Growth of graphene from solid carbon sources," Nature 468(7323): 549-552 (Nov. 25, 2010; including corrigendum in Nature 471(7336): 124 (Mar. 2011).
Tan et al., "Beta-cell regeneration and differentiation: how close are we to the 'holy grail'?" J. Mol. Encodrinol. 53(3): R119-R129 (Dec. 1, 2014).
Tang et al., "Highly wrinkled cross-linked graphene oxide membranes for biological and charge-storage applications," Small 8(3): 423-431 (Feb. 6, 2012; first published online Dec. 13, 2011).
Xu et al., "Graphene-like Two-Dimensional Materials", Chemical Reviews 113: 3766-3798 (Jan. 3, 2013).
Zhao et al. "Two-Dimensional Material Membranes: An Emerging Platform for Controllable Mass Transport Applications," Small 10(22): 4521-4542 (Sep. 10, 2014).
Barreiro et al. "Understanding the catalyst-free transformation of amorphous carbon into graphene by current-induced annealing," Scientific Reports, 3 (Article 1115): 1-6 (Jan. 23, 2013).
Botari et al., "Graphene healing mechanisms: A theoretical investigation," Carbon, 99: 302-309 (Apr. 2016) (published online Dec. 12, 2015).
Chen et al., "Defect Scattering in Graphene," Physical Review Letters, 102: 236805-1-236805-4 (Jun. 12, 2009).
Chen et al., "Self-healing of defected graphene," Applied Physics Letters, 102(10): 103107-1-103107-5 (Mar. 13, 2013).
Cheng et al., "Ion Transport in Complex Layered Graphene-Based Membranes with Tuneable Interlayer Spacing," Science Advances 2(2): 1501272 (Feb. 12, 2016).
Crock et al., "Polymer Nanocomposites with Graphene-Based Hierarchical Fillers as Materials for Multifunctional Water Treatment Membranes." Water Research 47(12): 3984-3996 (Aug. 2013; first published online Mar. 29, 2013).
International Search Report and Written Opinion dated Jan. 13, 2017 from related PCT application PCT/US2016/027583.
International Search Report and Written Opinion dated Jan. 13, 2017 from related PCT application PCT/US2016/027594.
International Search Report and Written Opinion dated Jan. 13, 2017 from related PCT application PCT/US2016/027631.
International Search Report and Written Opinion dated Jan. 9, 2017 from related PCT application PCT/US2016/027628.
International Search Report and Written Opinion dated Jan. 9, 2017 from related PCT/US2016/027632.
International Search Report dated Dec. 27, 2016 from related PCT application PCT/US2016/052007.
International Search Report dated Dec. 8, 2016 from related PCT application PCT/US2016/027629.
Kjeldsen, T., "Yeast secretory expression of insulin precursors," Appl Microbiol Biotechnol, 54: 277-286 (May 2, 2000).
Lin et al., "A Direct and Polymer-Free Method for Transferring Graphene Grown by Chemical Vapor Deposition to Any Substrate," ACSNANO, 8(2): 1784-1791 (Jan. 28, 2014).
Liu et al. "Synthesis of high-quality monolayer and bilayer graphene on copper using chemical vapor deposition," Carbon, 49(13): 4122-4130 (Nov. 2011) (published online May 30, 2011).
O'Hern et al., "Nanofiltration across defect-sealed nanoporous monolayer graphene," Nano Letters, 15(5): 3254-3260 (published Apr. 27, 2015).
U.S. Corrected Notice of Allowance in U.S. Appl. No. 13/480,569 dated May 26, 2015.
U.S. Corrected Notice of Allowance in U.S. Appl. No. 14/819,273 dated Apr. 12, 2017.
U.S. Corrected Notice of Allowance in U.S. Appl. No. 14/856,198 dated Mar. 1, 2017.
U.S. Notice of Allowance in U.S. Appl. No. 13/480,569 dated Feb. 27, 2015.
U.S. Notice of Allowance in U.S. Appl. No. 14/819,273 dated Dec. 14, 2016.
U.S. Notice of Allowance in U.S. Appl. No. 14/856,198 dated Feb. 10, 2017.
U.S. Office Action in U.S. Appl. No. 14/609,325 dated Feb. 16, 2017.
U.S. Office Action in U.S. Appl. No. 13/480,569 dated Jul. 30, 2014.
U.S. Office Action in U.S. Appl. No. 14/193,007 dated Mar. 23, 2017.
U.S. Office Action in U.S. Appl. No. 14/656,580 dated Feb. 9, 2017.
U.S. Office Action in U.S. Appl. No. 14/843,944 dated Jan. 6, 2017.
U.S. Office Action in U.S. Appl. No. 14/856,471 dated Dec. 1, 2016.
U.S. Office Action in U.S. Appl. No. 15/099,464 dated Mar. 10, 2017.
U.S. Restriction Requirement in U.S. Appl. No. 14/193,007 dated Jul. 17, 2015.
Wang et al., "Graphene Oxide Membranes with Tunable Permeability due to Embedded Carbon Dots." Chemical Communications 50(86): 13089-13092 (Nov. 2014; first published online Sep. 3, 2014).
Written Opinion dated Dec. 20, 2016 from related PCT application PCT/US2016/052010.
Written Opinion dated Jan. 6, 2017 from related PCT application PCT/US2016/027590.
Xu et al., "Graphene Oxide-TiO2 Composite Filtration Membranes and their Potential Application for Water Purification." Carbon 62: 465-471 (Oct. 2013; first published online Jun. 21, 2013).
Zhao et al., "A glucose-responsive controlled release of insulin system based on enzyme multilayers-coated mesoporous silica particles," Chem. Commun., 47: 9459-9461 (Jun. 15, 2011).

(56) References Cited

OTHER PUBLICATIONS

"Pall Water Processing Disc-Tube Filter Technology", Pall Corporation, [retrieved on Feb. 10, 2015], retrieved from http://www.pall.com/pdfs/Fuels-and-Chemicals/Disc-Tube_Filter_Technoloqy-DT100b.pdF.
AE Search and Examination Report for United Arab Emirates Application No. P186/13 dated Oct. 4, 2016.
Agenor et al., "Renal tubular dysfunction in human visceral leishmaniasis (Kala-azar)," Clinical Nephrology 71(5): 492-500 (May 2009) (available online Mar. 21, 2011).
Albert et al., "Ringer's lactate is compatible with the rapid infusion of AS-3 preserved packed red blood cells," Can. J. Anaesth. 56(5): 352-356 (May 2009) (available online Apr. 2, 2009).
Aluru et al. "Modeling electronics on the nanoscale." Handbook of nanoscience, engineering and technology Goddard W, Brenner D, Lyshevski S, lafrate GJ (2002): 11-1.
Alvarenga, "Carbon nanotube materials for aerospace wiring" Rochester Institute of Technology, 2010.
AMI Applied Membranes Inc., Filmtec Nanofiltration Membrane Elements, appliedmembranes.com/nanofiltration_elements.htm, accessed Apr. 28, 2015.
Aso et al., "Comparison of serum high-molecular weight (HMW) adiponectin with total adiponectin concentrations in type 2 diabetic patients with coronary artery using a novel enzyme-linked immunosorbent assay to detect HMW adiponectin," Diabetes 55(7): 1954-1960 (Jul 2006).
AU Examination Report for Australian Patent Application No. 2013235234, dated Jan. 13, 2017, 4 pages.
AU Notice of Acceptance for Australian Application No. 2011293742 dated Jan. 13, 2016.
Axelsson et al., "Acute hyperglycemia induces rapid, reversible increases in glomerular permeability in nondiabetic rats," Am. J. Physiol. Renal Physiol. 298(6): F1306-F1312 (Jun. 2010) (available online Mar. 17, 2010).
Bae et al. "Roll-to-roll production of 30-inch graphene films for transparent electrodes." Nature nanotechnology 5.8 (2010): 574-578.
Bains et al., "Novel lectins from rhizomes of two Acorus species with mitogenic activity and inhibitory potential towards murine cancer cell lines," Int'l Immunopharmacol. 5(9): 1470-1478 (Aug. 2005) (available online May 12, 2005).
Baker, "Membrane Technology and Applications", Membrane Technology and Applications; Apr. 14, 2004; pp. 92-94.
Barreiro et al. "Transport properties of graphene in the high-current limit." Physical review letters 103.7 (2009): 076601.
Bazargani et al. "Low molecular weight heparin improves peritoneal ultrafiltration and blocks complement and coagulation," Peritoneal Dialysis Int'l 25(4): 394-404 (Jul 2005-Aug 2005).
Bazargani, "Acute inflammation in peritoneal dialysis: experimental studies in rats. Characterization of regulatory mechanisms," Swedish Dental J. Supp. 171: 1-57, i (2005).
Beppu et al., "Antidiabetic effects of dietary administration of Aloe arborescens Miller components on multiple low-dose streptozotocin-induced diabetes in mice: investigation on hypoglycemic action and systemic absorption dynamics of aloe components," J. Ethnopharmacol. 103(3): 468-77 (Feb. 20, 2006) (available online Jan. 6, 2006).
Bieri et al. "Two-dimensional Polymer Formation on Surfaces: Insight into the Roles of Precursor Mobility and Reactivity" JACS, 2010, vol. 132, pp. 16669-16676.
Bruin et al., "Maturation and function of human embryonic stem cell-derived pancreatic progenitors in macroencapsulation devices following transplant into mice", Diabetologia (2013), vol. 56: 1987-1998 (Jun. 16, 2013).
Chu Ju, et al. "Modern Biotechnology" East China University of Technology Press, (Sep. 2007), vol. 1; pp. 306-307, ISBN 978-7-5628-2116-8.
Clochard, "Track-etched polymer membranes," Ecole Polytechnique,<<lsi.polytechnique.fr/home/research/physics-and-chemistry-of-nano-objects/track-etched-polymer-membranes-97035.kjsp>> Accessed Jul. 30, 2015.
CN Notification of Grant for Chinese Application No. 201180049184.5 dated Jun. 6, 2016.
CN Office Action for Chinese Application No. 201380014845.X dated Jul. 8, 2016.
CN Office Action for Chinese Application No. 201380014845.X dated Sep. 2, 2015.
CN Office Action for Chinese Application No. 201380019165.5 dated Aug. 25, 2015.
CN Office Action for Chinese Application No. 201380073141.X dated Jun. 8, 2016.
CN Office Action for Chinese Application No. 201380073141.X dated Mar. 21, 2017.
CN Office Action for Chinese Application No. 201480015372.X dated Aug. 2, 2016.
CN Office Action for Chinese Application No. 20118004918.5 dated Jun. 15, 2015.
CN Office Action for Chinese Application No. 201180049184.5 dated Jul. 30, 2014.
CN Office Action for Chinese Application No. 201180049184.5 dated Mar. 4, 2016.
CN Office Action for Chinese Application No. 201380014845.X dated Dec. 23, 2016.
CN Office Action for Chinese Application No. 201380017644.5 dated Feb. 7, 2017.
CN Office Action for Chinese Application No. 201380017644.5 dated May 26, 2016.
CN Office Action for Chinese Application No. 201380017644.5 dated Sep. 29, 2015.
CN Office Action in Chinese Application No. 201380013988.9 dated Oct. 27, 2015.
Database WPI, Week 201238, Thomson Scientific, London, GB; AN 2012-D49442.
De Lannoy et al., "Aquatic Biofouling Prevention by Electrically Charged Nanocomposite Polymer Thin Film Membranes", 2013 American Water Work Association membrane Technology Conference; Environmental science & technology 47.6 (2013): 2760-2768.
Deng et al., "Renal protection in chronic kidney disease: hypoxia-inducible factor activation vs. angiotensin II blockade," Am. J. Physiol. Renal Physiol. 299(6): F1365-F1373 (Dec. 2010) (available online Sep. 29, 2010).
Edwards, "Large Sheets of Graphene Film Produced for Transparent Electrodes (w/ Video)"; (2010) PhysOrg.com.
EP Office Action for European Application No. 13715529.7 dated Jun. 24, 2016.
Fayerman, "Canadian scientists use stem cells to reverse diabetes in mice", The Telegraph-Journal (New Brunswick), 1-2 (Jun. 29, 2012).
Fayerman, "Diabetes reversed in mice; University of B.C. scientists use embryonic stem cells to deal with Type 1 disease", The Vancouver Sun (British Columbia), 1-2 (Jun. 28, 2012).
Fejes et al. "A review of the properties and CVD synthesis of coiled carbon nanotubes." Materials 3.4 (2010): 2618-2642.
Franzen, C. "MIT Setting Up Industrial-Scale Graphene Printing Press" Sep. 23, 2011 [retrieved from http://talkingpointsmemo.com/idealab/mit-setting-up-industrial-scale-graphene-printing-press].
Freedman et al., "Genetic basis of nondiabetic end-stage renal disease," Semin. Nephrol. 30(2): 101-110 (Mar. 2010).
Garcia-Lopez et al., "Determination of high and low molecular weight molecules of icodextrin in plasma and dialysate, using gel filtration chromatography, in peritoneal dialysis patients," Peritoneal Dialysis Int'l 25(2): 181-191 (Mar. 2005-Apr. 2005).
Georgakilas et al., "Functionalization of Graphene: Covalent and Non-Covalent Approaches, Derivatives and Applications," Chem. Rev., (2012) 112(11), pp. 6156-6214.
Gnudi "Molecular mechanisms of proteinuria in diabetes," Biochem. Soc. Trans. 36(5): 946-949 (Oct. 2008).
Gotloib et al., "Peritoneal dialysis in refractory end-stage congestive heart failure: a challenge facing a no-win situation," Nephrol. Dialysis. Transplant. 20(Supp. 7): vii32-vii36 (Jul 2005).

(56) References Cited

OTHER PUBLICATIONS

Harvey "Carbon as conductor: a pragmatic view." Proceedings of the 61st IWCS Conference, http://www.iwcs.org/archives/56333-iwcs-2012b-1.1584632. vol. 1. 2012.
Hashimoto et al. "Direct evidence for atomic defects in graphene layers." Nature 430.7002 (2004): 870-873.
He, et al. "The attachment of Fe3 O4 nanoparticles to graphene oxide by covalent bonding." Carbon 48.11 (2010): 3139-3144.
Hone et al. "Graphene has record-breaking strength" Physicsworld.com, Jul. 17, 2008.
Huang et al., "Gene expression profile in circulating mononuclear cells afterexposure to ultrafine carbon particles," Inhalation Toxicol. 22(10): 835-846 (Aug 2010).
Humplik, et al. "Nanostructured materials for water desalination." Nanotechnology 22.29 (2011): 292001.
International Search Report and Written Opinion dated Jan. 5, 2012 for related International Application No. PCT/US11/47800.
International Search Report and Written Opinion dated Mar. 12, 2014 for International Application No. PCT/US2013/074942.
International Search Report and Written Opinion for International Application No. PCT/US2011/047800 dated Jan. 5, 2012.
International Search Report and Written Opinion for PCT Application No. PCT/US2014/023027 dated Jun. 26, 2014.
International Search Report and Written Opinion in International Application No. PCT/US2013/030344 dated Jun. 19, 2013.
International Search Report and Written Opinion in International Application No. PCT/US2013/033035 dated Jun. 28, 2013.
International Search Report and Written Opinion in International Application No. PCT/US2013/033400, dated Jun. 28, 2013.
International Search Report and Written Opinion in International Application No. PCT/US2013/033403 dated Jun. 28, 2013.
International Search Report and Written Opinion in PCT/US2014/041766, dated Sep. 30, 2014.
International Search Report and Written Opinion dated Jun. 5, 2014 in International Application No. PCT/US2014/021677.
International Search Report and Written Opinion dated Jun. 6, 2014 in International Application No. PCT/US2014/023043.
International Search Report and Written Opinion dated Dec. 16, 2014, for International Application No. PCT/US2014/051011.
International Search Report and Written Opinion dated Jun. 19, 2015, in International Application No. PCT/US2015/020287.
Inui et al. "Molecular dynamics simulations of nanopore processing in a graphene sheet by using gas cluster ion beam." Applied Physics A: Materials Science & Processing 98.4 (2010): 787-794.
Israelachvili, "Intermolecular and Surface Forces," 3rd ed., Chap. 7.1, Sizes of Atoms, Molecules, and Ions, 2011, 1 page.
Jiao et al., "Castration differentially alters basal and leucine-stimulated tissue protein synthesis in skeletal muscle and adipose tissue," Am. J. Physiol. Endocrinol. Metab. 297(5): E1222-1232 (Nov. 2009) (available online Sep. 15, 2009).
JP Office Action in Japanese Application No. 2015-501729 dated Dec. 9, 2016 (English translation).
JP Office Action in Japanese Application No. 2015-501867 dated Oct. 11, 2016.
JP Office Action in Japanese Application No. 2015-503405 dated Nov. 14, 2016.
JP Office Action in Japanese Application No. 2015-503406 dated Dec. 6, 2016.
Kang et al., "Effect of eplerenone, enalapril and their combination treatment on diabetic nephropathy in type II diabetic rats," Nephrol. Dialysis Transplant. 24(1): 73-84 (Jan. 2009).
Kar et al., "Effect of glycation of hemoglobin on its interaction with trifluoperazine," Protein J. 25(3): 202-211 (Apr. 2006) (available online Jun. 6, 2006).
Kawamoto et al., "Serum high molecular weight adiponectin is associated with mild renal dysfunction in Japanese adults," J. Atherosclerosis Thrombosis 17(11): 1141-1148 (Nov. 27, 2011).

Khun et al. "From Microporous Regular Frameworks to Mesoporous Materials with Ultrahigh Surface Area: Dynamic reorganization of Porous Polymer Networks" JACS, 2008, vol. 130, pp. 13333-13337.
Krupka et al., "Measurements of the Sheet Resistance and Conductivity of Thin Epitaxial Graphene and SiC Films" Applied Physics Letters 96, 082101-I; Feb. 23, 2010.
Kumar et al., "Modulation of alpha-crystallin chaperone activity in diabetic rat lens by curcumin," Molecular Vision 11: 561-568 (Jul 26, 2005).
Lathuiliere et al., "Encapsulated Cellular Implants for Recombinant Protein Delivery and Therapeutic Modulation of the Immune System," Journal of Applied Physics, Int. J. Mol. Sci., 16: 10578-10600 (May 8, 2015).
Lee, et al. "Measurement of the elastic properties and intrinsic strength of monolayer graphene." science 321.5887 (2008): 385-388.
Lucchese et al. "Quantifying ion-induced defects and Raman relaxation length in graphene." Carbon 48.5 (2010): 1592-1597.
Macleod et al. "Supramolecular Orderinng in Oligothiophene-Fullerene Monolayers" JAGS, 2009, vol. 131, pp. 16844-16850.
Mattevi et al. "A review of chemical vapour deposition of graphene on copper." Journal of Materials Chemistry 21.10 (2011): 3324-3334.
Miao et al. "Chemical vapor deposition of grapheme" INTECH Open Access Publisher, 2011.
MIT/MTL Center for Graphene Devices and 2D Systems, retrieved from: http://www-mtl.mit.edu/wpmu/graphene/ [retrieved from Aug. 21, 2014 archive].
MIT/MTL Center for Graphene Devices and 2D Systems, retrieved from: http://www-mtl.mit.edu/wpmu/graphene/ [retrieved from Mar. 4, 2015 archive].
Nezlin, "Circulating non-immune IgG complexes in health and disease," Immunol. Lett. 122(2); 141144 (Feb. 21, 2009) (available online Feb. 2, 2009).
Norata et al., "Plasma adiponectin levels in chronic kidney disease patients: relation with molecular inflammatory profile and metabolic status," Nutr. Metab. Cardiovasc. Dis. 20(1): 56-63 (Jan. 2010) (available online Apr. 9, 2009).
Ogawa et al., "Exosome-like vesicles in Gloydius blomhoffii blomhoffii venom," Toxicon 51(6): 984-993 (May 2008) (available online Feb. 19, 2008).
Oki et al., "Combined acromegaly and subclinical Cushing disease related to high-molecular-weight adrenocorticotropic hormone," J. Neurosurg. 110(2): 369-73 (Feb. 2009).
Osorio et al., "Effect of treatment with losartan on salt sensitivity and SGLT2 expression in hypertensive diabetic rats," Diabetes Res. Clin. Pract. 86(3): e46-e49 (Dec. 2009) (available online Oct. 2, 2009).
Osorio et al., "Effect of phlorizin on SGLT2 expression in the kidney of diabetic rats," J. Nephrol. 23(5): 541-546 (Sep.-Oct. 2010).
Padidela et al., "Elevated basal and post-feed glucagon-like peptide 1 (GLP-1) concentrations in the neonatal period," Eur. J. Endocrinol. 160(1): 53-58 (Jan. 2009) (available online Oct. 24, 2008).
Plant et al. "Size-dependent propagation of Au nanoclusters through few-layer grapheme," The Royal Society of Chemistry 2013, Nanoscale.
Pollard, "Growing Graphene via Chemical Vapor" Department of Physics, Pomona College; May 2, 2011.
Rezania et al., "Enrichment of Human Embryonic Stem Cell-Derived NKX6.1-Expressing Pancreatic Progenitor Cells Accelerates the Maturation of Insulin-Secreting Cells in Vivo", Stem Cells Regenerative Medicine, vol. 31: 2432-2442 (Jul. 29, 2013).
Rezania et al., "Maturation of Human Embryonic Stem Cell-Derived Pancreatic Progenitors Into Functional Islets Capable of Treating Pre-existing Diabetes in Mice", Diabetes Journal, vol. 61: 2016-2029 (Aug. 1, 2012).
Ribeiro et al., "Binary Mutual Diffusion Coefficients of Aqueous Solutions of Sucrose, Lactose, Glucose, and Fructose in the Temperature Range from (298.15 to 328.15) K," J. Chem. Eng. Data 51(5): 1836-1840 (Sep. 2006) (available online Jul. 20, 2006).

(56) References Cited

OTHER PUBLICATIONS

Rippe et al., "Size and charge selectivity of the glomerular filter in early experimental diabetes in rats," Am. J. Physiol. Renal Physiol. 293(5): F1533-F1538 (Nov. 2007)(available online Aug. 15, 2007).
SA Final Rejection for Saudi Arabia Application No. 113340400 dated Jan. 28, 2016.
SA First Examination Report for Saudi Arabia Application No. 113340401 dated Apr. 28, 2015.
SA First Examination Report for Saudi Arabia Application No. 113340424 dated May 10, 2015.
SA First Examination Report for Saudi Arabia Application No. 113340426 dated May 12, 2015.
SA First Examination Report in Saudi Arabia Application No. 113340400 dated Apr. 13, 2015.
SA Second Examination Report for Saudi Arabia Application No. 113340400 dated Aug. 11, 2015.
Sethna et al., "Serum adiponectin levels and ambulatory blood pressure monitoring in pediatric renal transplant recipients," Transplantation 88(8): 1030-1037 (Oct 27, 2009).
Sullivan et al., "Microarray analysis reveals novel gene expression changes associated with erectile dysfunction in diabetic rats," Physiol. Genom. 23(2): 192-205 (Oct. 17, 2005) (available online Aug. 23, 2005).
Swett et al, "Imagining and Sculpting Graphene on the atomic scale" Oak Ridge National Laboratory's (ORNL) Center for Nanophase Materials Sciences (CNMS) Biannual Review. 1 page.
Swett et al, "Supersonic Nanoparticle Interaction with Suspended CVD Graphene", Microsc. Microanal. 22 (Suppl 3): 1670-1671 (Jul. 25, 2016).
Takata et al., "Hyperresistinemia is associated with coexistence of hypertension and type 2 diabetes," Hypertension 51. 2 (Feb 2008): 534-9.
Tamborlane et al., "Continuous Glucose Monitoring and Intensive Treatment of Type 1 Diabetes" N Engl J Med 359;14: 1464-1476.
Tanugi et al., "Nanoporous Graphene Could Outperform Best Commercial Water Desalination Techniques,"; ACS 2012; Jun. 25, 2012; Weftec 2012; Sep. 29-Oct. 3.
Totani et al. "Gluten binds cytotoxic compounds generated in heated frying oil." Journal of oleo science 57.12 (2008): 683-690.
Tsukamoto et al. "Purification, characterization and biological activities of a garlic oliqosaccharide," Journal of UOEH 30. 2 (Jun. 1, 2008): 147-57.
TW Office Action in Taiwanese Application No. 102146079 dated Apr. 14, 2017. (with English translation).
TW Search Report in Taiwanese Application No. 102146079 dated Apr. 14, 2017.
Umea Universitet "Graphene nanoscrolls are formed by decoration of magnetic nanoparticles." ScienceDaily. Aug. 15, 2013. https://www.sciencedaily.com/releases/2013/08/130815084402.htm.
U.S. Notice of Allowance for U.S. Appl. No. 12/868,150 dated Sep. 25, 2012.
U.S. Notice of Allowance for U.S. Appl. No. 13/548,539 dated Aug. 18, 2015.
U.S. Notice of Allowance for U.S. Appl. No. 13/548,539 dated Jul. 23, 2015.
U.S. Notice of Allowance for U.S. Appl. No. 13/719,579 dated May 20 ,2016.
U.S. Notice of Allowance for U.S. Appl. No. 13/795,276 dated Oct. 7, 2016.
U.S. Notice of Allowance for U.S. Appl. No. 13/802,896 dated Apr. 1, 2015.
U.S. Notice of Allowance for U.S. Appl. No. 13/803,958 dated Aug. 29, 2016.
U.S. Notice of Allowance for U.S. Appl. No. 13/803,958 dated Jun. 2, 2016.
U.S. Notice of Allowance for U.S. Appl. No. 13/803,958 dated Sep. 12, 2016.
U.S. Notice of Allowance for U.S. Appl. No. 13/804,085 dated Jan. 15, 2015.
U.S. Notice of Allowance for U.S. Appl. No. 13/804,085 dated Mar. 12, 2015.
U.S. Notice of Allowance for U.S. Appl. No. 13/923,503 dated Oct. 14, 2016.
U.S. Notice of Allowance for U.S. Appl. No. 13/923,503 dated Oct. 5, 2016.
U.S. Notice of Allowance for U.S. Appl. No. 14/200,195 dated Jul. 5, 2016.
U.S. Notice of Allowance for U.S. Appl. No. 14/200,530 dated Aug. 1, 2016.
U.S. Notice of Allowance for U.S. Appl. No. 14/203,655 dated Dec. 9, 2016.
U.S. Notice of Allowance in U.S. Appl. No. 12/868,150 dated Sep. 25, 2012.
U.S. Notice of Allowance in U.S. Appl. No. 13/803,958 dated Aug. 29, 2016.
U.S. Notice of Allowance in U.S. Appl. No. 13/803,958 dated Sep. 12, 2016.
U.S. Notice of Allowance in U.S. Appl. No. 14/656,580 dated May 8, 2017.
U.S. Notice of Allowance in U.S. Appl. No. 13/795,276 dated Jan. 19, 2017.
U.S. Office Action for U.S. Appl. No. 13/548,539 dated Feb. 6, 2015.
U.S. Office Action for U.S. Appl. No. 13/719,579 dated Jul. 8, 2015.
U.S. Office Action for U.S. Appl. No. 13/719,579 dated May 4, 2016.
U.S. Office Action for U.S. Appl. No. 13/795,276 dated Apr. 22, 2016.
U.S. Office Action for U.S. Appl. No. 13/795,276 dated Oct. 6, 2015.
U.S. Office Action for U.S. Appl. No. 13/802,896 dated Sep. 24, 2014.
U.S. Office Action for U.S. Appl. No. 13/803,958 dated Aug. 11, 2014.
U.S. Office Action for U.S. Appl. No. 13/803,958 dated May 28, 2015.
U.S. Office Action for U.S. Appl. No. 13/803,958 dated Nov. 18, 2015.
U.S. Office Action for U.S. Appl. No. 13/923,503 dated Mar. 22, 2016.
U.S. Office Action for U.S. Appl. No. 14/031,300 dated Jan. 20, 2016.
U.S. Office Action for U.S. Appl. No. 14/031,300 dated Jul. 7, 2015.
U.S. Office Action for U.S. Appl. No. 14/200,195 dated Mar. 21, 2016.
U.S. Office Action for U.S. Appl. No. 14/200,195 dated Nov. 4, 2015.
U.S. Office Action for U.S. Appl. No. 14/200,530 dated Feb. 29, 2016.
U.S. Office Action for U.S. Appl. No. 14/203,655 dated Aug. 10, 2016.
U.S. Office Action for U.S. Appl. No. 14/656,190 dated May 18, 2017.
U.S. Office Action for U.S. Appl. No. 14/858,741 dated Dec. 1, 2016.
U.S. Office Action for U.S. Appl. No. 15/289,944 dated Feb. 9, 2017.
U.S. Office Action for U.S. Appl. No. 15/336,545 dated Dec. 19, 2016.
U.S. Office Action in U.S. Appl. No. 14/193,007 dated Apr. 24, 2017.
U.S. Office Action in U.S. Appl. No. 14/656,617 dated Apr. 4, 2017.
U.S. Office Action on U.S. Appl. No. 14/656,335 dated Apr., 25 2017.
U.S. Office Action on U.S. Appl. No. 15/332,982 dated Jan. 30, 2017.
Vallon,"Micropuncturing the nephron," Pflugers Archiv : European journal of physiology 458. 1 (May 2009): 189-201.
Van Der Zande et al. "Large-scale arrays of single-layer graphene resonators." Nano letters 10.12 (2010): 4869-4873.
Verdonck, P., "Plasma Etching", in Oficina de Microfabricao: Projeto e Construcao de Ci's MOS, Swart, J.W., Ed., Campinas (Sao Paulo, Brazil): Unicamp, 2006, ch. 10, p. 9.
Vlassiouk et al. "Large scale atmospheric pressure chemical vapor deposition of graphene." Carbon 54 (2013): 58-67.
Vriens et al. "Methodological considerations in quantification of oncological FDG PET studies." European journal of nuclear medicine and molecular imaging 37.7 (2010): 1408-1425.
Wang et al., "Direct Observation of a Long-Lived Single-Atom Catalyst Chiseling Atomic Structures in Graphene," Nano Lett., 2014, pp. A-F.

(56) References Cited

OTHER PUBLICATIONS

Wang et al., "Porous Nanocarbons: Molecular Filtration and Electronics," Advances in Graphene Science, Edited by Mahmood Aliofkhazraei, (2013) ISBN 978-953-51/1182-5, Publisher: InTech; Chapter 6, pp. 119-160.
Wang et al.,"What is the role of the second "structural " NADP+-binding site in human glucose 6-phosphate dehydrogenase?,"Protein science a publication of the Protein Society 17. 8 (Aug 2008): 1403-11.
Wei et al., "Synthesis of N-doped graphene by chemical vapor deposition and its electrical properties", Nano Lett. 2009 9 1752-58.
Xiaogan Liang et al., Formation of Bandgap and Subbands in Graphene Nanomeshes with Sub-10nm Ribbon Width Fabricated via Nanoimprint Lithography., Nano Letters, Jun. 11, 2010, pp. 2454-2460.
Xie et al., "Fractionation and characterization of biologically-active polysaccharides from Artemisia tripartite," Phytochemistry 69. 6 (Apr 2008): 1359-71.
Xie, et al. "Controlled fabrication of high-quality carbon nanoscrolls from monolayer graphene." Nano letters 9.7 (2009): 2565-2570.
Yagil et al. "Nonproteinuric diabetes-associated nephropathy in the Cohen rat model of type 2 diabetes" Diabetes 54. 5 (May 2005): 1487-96.
Zan et al. "Interaction of Metals with Suspended Graphene Observed by Transmission Electron Microscopy", J. Phys. Chem. Lett. 2012, 3, 953-958.
Zhang et al. "Effect of chemical oxidation on the structure of single-walled carbon nanotubes", J. Phys. Chem., 2003, B 107 3712-8.
Zhang et al. "Method for anisotropic etching of graphite or graphene" Institute of Physics, Chinese Academy of Sciences; PEOP. Rep. China; Mar. 30, 2011.
Zhang et al. "Production of Graphene Sheets by Direct Dispersion with Aromatic Healing Agents", Small 2010, x, No. x, 1-8.
Zhang et al. "Isolation and activity of an alpha-amylase inhibitor from white kidney beans," Yao xue xue bao =Acta pharmaceutica Sinica 42. 12 (Dec 2007): 1282-7.
Zhao, et al. "Efficient preparation of large-area graphene oxide sheets for transparent conductive films." ACS nano 4.9 (2010): 5245-5252.
Zhou, K., et al., "One-pot preparation of graphene/Fe3O4 composites by a solvothermal reaction," New J. Chem., 2010, 34, 2950.
Zhu et al. "Carbon nanotubes in biomedicine and biosensing." Carbon nanotubes-Growth and Applications. InTech, (2011) Chapter 6: pp. 135-162. Available from: https://www.intechopen.com/books/carbon-nanotubes-growth-and-applications/carbon-nanotubes-in-biomedicine-and-biosensing.
Ziegelmeier et al. "Adipokines influencing metabolic and cardiovascular disease are differentially regulated in maintenance hemodialysis," Metabolism: clinical and experimental 57. 10 (Oct. 2008): 1414-21.
Zirk et al. "A refractometry-based glucose analysis of body fluids," Medical engineering & physics 29. 4 (May 2007): 449-58.
Zyga "Nanoporous Graphene Could Outperform Best Commercial Water Desalination Techniques," Phys.org. http://www.phys.org/pdf259579929.pdf. [Last Accessed Dec. 3, 2014].
AU Examination Report for Australian Patent Application No. 2013363283, dated Jun. 20, 2017, 4 pages.
Daniel et al. "Implantable Diagnostic Device for Cancer Monitoring." Biosens Bioelectricon. 24(11): 3252-3257 (Jul. 15, 2009).
International Search Report and Written Opinion dated Jul. 5, 2017 from related PCT application PCT/US2017/024147.
JP Office Action in Japanese Application No. 2015-501729 dated Jun. 20, 2017 (English translation).
Kang et al., "Efficient Transfer of Large-Area Graphene Films onto Rigid Substrates by Hot Pressing," American Chemical Society Nano, 6(6): 5360-5365(May 28, 2012).
Nafea, et al. "Immunoisolating semi-permeable membranes for cell encapsulation: focus on hydrogels." J Control Release. 154(2): 110-122 (Sep. 5, 2011).
Ohgawara et al. "Assessment of pore size of semipermeable membrane for immunoisolation on xenoimplatntation of pancreatic B cells using a diffusion chamber." Transplant Proc. (6): 3319-3320. 1995.
Rafael et al. "Cell Transplantation and Immunoisolation: Studies on a macroencapsultaion device." From the Departments of Transplantation Pathology: Stockholm, Sweden (1999).
Sanchez, et al. "Biological Interactions of Graphene-Family Nanomaterials—An Interdisciplinary Review." Chem Res Toxicol. 25(1): 15-34 (Jan. 13, 2012).
U.S. Notice of Allowance in U.S. Appl. No. 14/819,273 dated Jun. 9, 2017.
U.S. Notice of Allowance in U.S. Appl. No. 15/099,464 dated Jun. 16, 2017.
U.S. Office Action for U.S. Appl. No. 14/656,657 dated Jul. 7, 2017.
U.S. Office Action for U.S. Appl. No. 14/686,452 dated Jun. 9, 2017.
U.S. Office Action for U.S. Appl. No. 14/843,944 dated Jun. 23, 2017.
U.S. Office Action for U.S. Appl. No. 14/856,471 dated May 31, 2017.
U.S. Office Action for U.S. Appl. No. 15/453,441 dated Jun. 5, 2017.
CN Office Action in Chinese Application No. 201580006829.5 dated Aug. 1, 2017. (English translation) (8 pages).
EP Office Action for European Application No. 15743307.9 dated Aug. 8, 2017. (17 pages).
European Search Report dated Aug. 28, 2017 from related EP application 15743750.0. (7 pages).
International Search Report and Written Opinion dated Aug. 14, 2017 from related PCT application PCT/US2017/031537. (12 pages).
Jiang, L. et al., Design of advanced porous grapheme materials: from grapheme nanomesh to 3D architectures. Nanoscale, Oct. 16, 2013, vol. 6, pp. 1922-1945.
JP Office Action in Japanese Application No. 2015-503405 dated Jun. 28, 2017. (English translation) (6 pages).
JP Office Action in Japanese Application No. 2015-549508 dated Jun. 27, 2017. (English translation) (7 pages).
Li, R.H. "Materials for immunoisolated cell transplantation". Adv. Drug Deliv. Rev. 33, 87-109 (1998). (23 pages).
Schweitzer, Handbook of Separation Techniques for Chemical Engineers, 1979, McGraw-Hill Book Company, pp. 2-5-2-8.
Search Report and Written Opinion dated Aug. 14, 2017 for Singapore Application No. 11201606287V. (10 pages).
Search Report and Written Opinion dated Aug. 22, 2017 for Singapore Application No. 11201607584P. (7 pages).
Sears et al., "Recent Developments in Carbon Nanotube Membranes for Water Purification and Gas Separation" Materials, vol. 3 (Jan. 4, 2010), pp. 127-149.
U.S. Notice of Allowance in U.S. Appl. No. 14/193,007 dated Sep. 6, 2017. (9 pages).
U.S. Notice of Allowance in U.S. Appl. No. 14/656,580 dated Sep. 5, 2017. (8 pages).
U.S. Office Action for U.S. Appl. No. 14/609,325 dated Aug. 25, 2017. (7 pages).
U.S. Office Action for U.S. Appl. No. 15/099,193 dated Jul. 19, 2017. (13 pages).
U.S. Office Action for U.S. Appl. No. 15/289,944 dated Jul. 13, 2017. (18 pages).
U.S. Office Action for U.S Appl. No. 15/332,982 dated Aug. 18, 2017. (9 pages).

* cited by examiner

METHODS FOR PERFORATING TWO-DIMENSIONAL MATERIALS USING A BROAD ION FIELD

CROSS-REFERENCE TO RELATED APPLICATIONS

This application claims the benefit of priority under 35 U.S.C. §119 from U.S. Provisional Patent Applications 61/934,530, filed Jan. 31, 2014, which is incorporated herein by reference in its entirety.

STATEMENT REGARDING FEDERALLY SPONSORED RESEARCH OR DEVELOPMENT

Not applicable.

FIELD

The present disclosure generally relates to two-dimensional materials, and, more specifically, to processes for perforating two-dimensional materials.

BACKGROUND

Graphene represents a form of carbon in which the carbon atoms reside within a single atomically thin sheet or a few layered sheets (e.g., about 20 or less) of fused six-membered rings forming an extended planar lattice. In its various forms, graphene has garnered widespread interest for use in a number of applications, primarily due to its favorable combination of high electrical and thermal conductivity values, good in-plane mechanical strength, and unique optical and electronic properties. In many aspects, the properties of graphene parallel those of carbon nanotubes, since both nanomaterials are based upon an extended $sp^2$-hybridized carbon framework. Other two-dimensional materials having a thickness of a few nanometers or less and an extended planar lattice are also of interest for various applications. In an embodiment, a two dimensional material has a thickness of 0.3 to 1.2 nm. In other embodiment, a two dimensional material has a thickness of 0.3 to 3 nm.

Because of its extended planar structure, graphene offers several features that are not shared with carbon nanotubes. Of particular interest to industry are large-area graphene films for applications such as, for example, special barrier layers, coatings, large area conductive elements (e.g., RF radiators or antennas), integrated circuits, transparent electrodes, solar cells, gas barriers, flexible electronics and the like. In addition, graphene films can be produced in bulk much more inexpensively at the present time than can carbon nanotubes.

Some envisioned applications for graphene and other two-dimensional materials are predicated upon forming a plurality of nanometer-scale holes in the planar structure of these nanomaterials. The process of forming holes in graphene and other two-dimensional materials will be referred to herein as "perforation," and such nanomaterials will be referred to herein as being "perforated." In a graphene sheet an interstitial aperture is formed by each six carbon atom ring structure in the sheet and this interstitial aperture is less than one nanometer across. In particular, this interstitial aperture is believed to be about 0.3 nanometers across its longest dimension (the center to center distance between carbon atoms being about 0.28 nm and the aperture being somewhat smaller than this distance). Perforation of sheets comprising two-dimensional network structures typically refers to formation of holes larger than the interstitial apertures in the network structure.

Perforation of graphene and other two-dimensional materials can modify the electrical properties of the material and its resistance to flow of fluid through the material. For example, the hole density of perforated graphene can be used to tune the electrical conductivity of this nanomaterial and in some instances can be used to adjust its band gap. Filtration applications are another area where perforated graphene and other perforated two-dimensional materials have generated considerable interest. Due to the atomic-level thinness of graphene and other two-dimensional materials, it can be possible to achieve high liquid throughput fluxes during filtration processes, even with holes being present that are only single-nanometer in size.

High performance, high selectivity filtration applications are dependent upon a sufficient number of holes of a desired size being present in a filtration membrane. Although a number of processes are known for perforating graphene and other two-dimensional materials, production of holes with a desired size range, a narrow size distribution, and a high hole density remains a challenge. At least one of these parameters is often lacking in conventional perforation processes.

Chemical techniques can be used to create holes in graphene and other two-dimensional materials. Exposure of graphene or another two-dimensional material to ozone or an atmospheric pressure plasma (e.g., an oxygen/argon or nitrogen/argon plasma) can effect perforation, but the holes are often lacking in terms of their density and size distribution. In many instances, it can be difficult to separately control hole nucleation and hole growth, so these processes often yield broad distributions of hole sizes. Further, many chemical perforation techniques produce holes that are at the extremes of 1) low hole density and small hole size, and 2) high hole density and large hole size. Neither of these extremes is particularly desirable for filtration applications. The first extreme is undesirable in terms of throughput flux, and the second extreme is undesirable for selectively excluding impurities that are smaller than the hole size.

Physical techniques can also be used to remove matter from the planar structure of two-dimensional materials in order to create holes. Hyperthermal ion beams tend to make pores in graphene and other two-dimensional materials that are too small for effective filtration to occur, primarily because the interaction of graphene and other two-dimensional materials with ions at hyperthermal velocities can be rather poor. The hyperthermal energy regime is defined as being intermediate between the thermal and low energy regimes. For example, a hyperthermal energy regime includes the energy range between 1 eV and 500 eV. Focused ion beams, in contrast, tend to make holes that are too few in number. Due to their very high energy flux, focused ion beams can also be exceedingly damaging to many substrates upon which the two-dimensional material is disposed. Because of their high energy requirements and small beam size, it is also not considered practical to utilize focused ion beams for perforating a large dimensional area.

Nanomaterials perforated with holes in a size range of about 0.3 nm to about 10 nm with a high hole density and narrow hole size distribution can be particularly difficult to prepare. Holes within this size range can be particularly effective for various filtration applications including, for example, reverse osmosis, molecular filtration, ultrafiltration and nanofiltration processes. As an example, holes in the size range 0.3 nm to 0.5 nm may be used for some gas separation processes. Holes in the size range 0.7 nm to 1.2 nm may be used for some desalination processes.

In view of the foregoing, scalable processes for perforating graphene and other two-dimensional materials in order to produce holes with a high hole density, narrow size distribution and a small hole size would be of considerable interest in the art. In particular, scalable processes to produce holes having a size, hole density, and size distribution suited for various filtration applications would be of considerable interest in the art. The present disclosure satisfies the foregoing needs and provides related advantages as well.

SUMMARY

In various embodiments, processes for perforating a two-dimensional material are described herein. In one aspect, exposure of a composite of a layer including the two-dimensional material and a layer of another material to a source of ions produces a plurality of holes in the two-dimensional material even when the energy and/or flux of the ions is relatively low. In an embodiment, the layer of the other material is not a layer or sheet of a two-dimensional material.

In some embodiments, the processes for perforation can include (1) exposing a two-dimensional material in contact with at least one layer of a material other than the two-dimensional material to an ion source and (2) interacting a plurality of ions from the ion source with the two-dimensional material and with the at least one layer. In an embodiment, the at least one layer is in continuous contact with the two-dimensional material while the two-dimensional material is being exposed to the ion source. In an embodiment, the ions introduce a plurality of defects in the two-dimensional material and an interaction of the ions with the at least one layer promotes expansion of the defects into a plurality of holes defined in the two-dimensional material. In embodiments, the ion source provides an ion energy ranging from 0.75 keV to 10 keV, from 1 keV to 10 keV, from 1 keV to 5 keV, from 2 keV to 10 keV, or from 5 keV to 10 keV. In embodiments, the ion source provides an ion dose ranging from $1 \times 10^{10}$ ions/cm$^2$ to $1 \times 10^{17}$ ions/cm$^2$, from $1 \times 10^{11}$ ions/cm$^2$ to $1 \times 10^{15}$ ions/cm$^2$, or from $1 \times 10^{13}$ ions/cm$^2$ to $1 \times 10^{19}$ ions/cm$^2$.

In an embodiment, the process comprises the steps of exposing a composite multilayered material to ions produced by an ion source, the multilayered material comprising a first layer comprising a two-dimensional first material and a second layer of a second material in contact with the first layer; and producing a plurality of holes in the two-dimensional first material by interacting a plurality of ions from the ion source, neutralized ions from the ion source or a combination thereof with the two-dimensional first material and with the second material. In an embodiment the ion source is a broad beam or flood source. As regards the neutralized ions, in some embodiments at least a portion of the ions originating from the ion source are neutralized as they interact with the multilayered material. For example, an ion may be neutralized either near the surface of a given layer or during collisions within the layer. In an embodiment, the first layer has a first side and a second side with the first side facing the ion source. The first side of the first layer may be termed the "frontside" of the first layer.

In an embodiment, the second layer is a "frontside layer" disposed on the first side of the first layer. During exposure of the multilayered material to the source of ions, at least a portion of the ions and/or neutralized ions interact with the material of the frontside layer, with a plurality of the ions and/or neutralized ions passing through the frontside layer before interacting with the layer comprising the two-dimensional material. In an embodiment, the frontside layer is removed after perforation. When the second layer is a "backside layer" disposed on the second side of the first layer, at least a portion of the ions and/or neutralized ions interact with the two-dimensional material of the first layer, with a plurality of ions and/or neutralized ions passing through the first layer before interacting with the backside layer. The multilayered material may further comprise a third layer of a third material. In an embodiment, the third layer is disposed on the opposite side of the first layer from the second layer, so that the first layer comprising the two-dimensional material contacts both frontside and backside layers of other materials.

In an embodiment, the second material is selected so that interaction of the ions and/or neutralized ions with the second material contributes to the perforation process. In an embodiment, the second material forms fragments upon interaction with the ions and/or neutralized ions. The type of fragments formed depends at least in part on the second material. The fragments may be atoms, ions or fragments of molecules (e.g. part of a polymer chain).

When the layer of the second material is a frontside layer, the thickness of the layer is thin enough to allow the ions and/or neutralized ions to penetrate to the layer comprising the two-dimensional material. In an embodiment, the average thickness of the layer of the second material is from 1 to 10 nm. Frontside layers may be continuous or discontinuous. In some embodiments, the at least one layer can be a layer such as, deposited silicon, a deposited polymer, a condensed gas or a condensed organic compound or any combination thereof. In embodiments, the polymer comprises the elements carbon and hydrogen and optionally further comprises one or more elements selected from the group consisting of silicon, oxygen, nitrogen, fluorine, chlorine and bromine. In embodiments, the polymer is a polycarbonate, a polyacrylate, a polyethylene oxide, an epoxide, a silicone, polytetrafluoroethylene (PTFE) or polyvinyl chloride (PVC). In an embodiment, the condensed gas is a noble gas such as xenon. In embodiments, the condensed organic compound is a mercaptan, an amine or an alcohol. In an embodiment, the organic compound comprises an alkyl group having 2 to 15, 2 to 10 or 5 to 15 carbon atoms.

When the layer of the second material is a backside layer, the layer may be thicker than the layer comprising the two-dimensional material. In an embodiment, the backside layer is 1 micrometer to 10 micrometers thick. In an additional embodiment the backside layer is 5 micrometers to 10 micrometers thick. In an embodiment, the layer provides a substrate for the layer of the two-dimensional material. In an embodiment, the backside layer is a growth substrate upon which the graphene or other two-dimensional material is grown. In an embodiment, the growth substrate is a metal growth substrate. In an embodiment, the metal growth substrate is a substantially continuous layer of metal rather than a grid or mesh. Metal growth substrates compatible with growth of graphene and graphene-based materials include transition metals and their alloys. In embodiments, the metal growth substrate is copper based or nickel based. In embodiments, the metal growth substrate is copper or nickel. In another embodiment, the backside layer can be a secondary substrate to which the graphene or other two-dimensional material has been transferred following growth.

In embodiments, the energy of the ions ranges from 0.01 keV to 10 keV, 0.5 keV to 10 keV, 0.75 keV to 10 keV, from 1 keV to 10 keV, from 1 keV to 5 keV, from 2 keV to 10 keV, or from 5 keV to 10 keV. In embodiments, ion energies greater than 0.75 keV or 1 keV are preferred when the two-dimensional material comprises a sheet of graphene-based material and further comprises at least some non-graphenic carbon-based material. In embodiments, the ion source provides an ion dose to the multilayered material ranging from $1\times10^{10}$ ions/cm$^2$ to $1\times10^{17}$ ions/cm$^2$, from $1\times10^{11}$ ions/cm$^2$ to $1\times10^{15}$ ions/cm$^2$ or from $1\times10^{13}$ ions/cm$^2$ to $1\times10^{19}$ ions/cm$^2$. In an embodiment, the ion dose is adjusted based on the ion, with lighter ions (lower mass ions) being provided at a higher dosage. In embodiments, the ion flux or beam current density ranges from 0.1 nA/mm$^2$ to 100 nA/mm$^2$, from 0.1 nA/mm$^2$ to 10 nA/mm$^2$, 0.1 nA/mm$^2$ to 1 nA/mm$^2$, from 1 nA/mm$^2$ to 10 nA/mm$^2$, or from 10 nA/mm$^2$ to 100 nA/mm$^2$.

In various embodiments, the two-dimensional material comprises a sheet of a graphene-based material. In an embodiment, the first layer comprises a sheet of a graphene-based material. In an embodiment, the sheet of graphene-based material is a sheet of single or multilayer graphene or a sheet comprising a plurality of interconnected single or multilayer graphene domains. In embodiments, the multi-layer graphene domains have 2 to 5 layers or 2 to 10 layers. In an embodiment, the layer comprising the sheet of graphene-based material further comprises non-graphenic carbon-based material located on the surface of the sheet of graphene-based material. In an embodiment, the amount of non-graphenic carbon-based material is less than the amount of graphene. In embodiments, the amount of graphene in the graphene-based material is from 60% to 95% or from 75% to 100%.

In embodiments, the characteristic size of the perforation is from 0.3 to 10 nm, from 0.3 to 0.5 nm, from 0.4 to 10 nm, from 0.5 to 2.5 nm, from 0.5 to 10 nm, from 5 nm to 20 nm, from 0.7 nm to 1.2 nm, from 10 nm to 50 nm, from 50 nm to 100 nm from 50 nm to 150 nm, or from 100 nm to 200 nm. In an embodiment, the average pore size is within the specified range. In embodiments, 70% to 99%, 80% to 99%, 85% to 99% or 90 to 99% of the perforations fall within a specified range, but other pores fall outside the specified range. If the pores falling outside the specified range are larger than specified in the range, these pores may be termed "non-selective."

In more specific embodiments, the processes can include providing a sheet of a graphene-based material on a metal growth substrate, exposing the sheet of a graphene-based material to an ion source providing an ion dose ranging from $1\times10^{10}$ ions/cm$^2$ to $1\times10^{17}$ ions/cm$^2$, from $1\times10^{11}$ ions/cm$^2$ to $1\times10^{15}$ ions/cm$^2$ or from $1\times10^{13}$ ions/cm$^2$ to $1\times10^{19}$ ions/cm$^2$ and having an ion energy ranging from 0.75 keV to 10 keV, from 1 keV to 10 keV, from 1 keV to 5 keV, from 2 keV to 10 keV, or from 5 keV to 10 keV, interacting a plurality of ions and/or neutralized ions from the ion source with the graphene and with the metal growth substrate, in which the ions introduce a plurality of defects in the graphene and an interaction of the ions and/or neutralized ions with the metal growth substrate ejects toward the graphene a plurality of layer fragment from the metal growth substrate, and expanding the defects in the graphene with the layer fragments to define a plurality of holes in the graphene. The metal growth substrate is disposed on a side of the graphene opposite the ion source and constitutes a backside layer. In an embodiment when the layer is a metal growth substrate, the layer fragments constitute metal atoms or metal ions.

In other more specific embodiments, the processes includes exposing a sheet of a graphene-based material having thereon a frontside layer to an ion source providing an ion dose ranging from $1\times10^{10}$ ions/cm$^2$ to $1\times10^{17}$ ions/cm$^2$, from $1\times10^{11}$ ions/cm$^2$ to $1\times10^{15}$ ions/cm$^2$ or from $1\times10^{13}$ ions/cm$^2$ to $1\times10^{19}$ ions/cm$^2$ and having an ion energy ranging from 0.75 keV to 10 keV, from 1 keV to 10 keV, from 1 keV to 5 keV, from 2 keV to 10 keV, or from 5 keV to 10 keV, interacting a plurality of ions and/or neutralized ions from the ion source with the graphene and with the frontside layer to introduce a plurality of defects in the graphene. In an embodiment, interaction of the ions and/or neutralized ions with the frontside layer ejects toward the graphene a plurality of layer fragments, and expanding the defects in the graphene with the layer fragments to define a plurality of holes in the graphene. The frontside layer is disposed on the same side of the graphene as the ion source.

In still other more specific embodiments, the processes can include exposing a sheet of a graphene-based material present on a backside layer to an ion source providing an ion dose ranging from $1\times10^{10}$ ions/cm$^2$ to $1\times10^{17}$ ions/cm$^2$, from $1\times10^{11}$ ions/cm$^2$ to $1\times10^{15}$ ions/cm$^2$ or from $1\times10^{13}$ ions/cm$^2$ to $1\times10^{19}$ ions/cm$^2$ and having an ion energy ranging from 0.75 keV to 10 keV, from 1 keV to 10 keV, from 1 keV to 5 keV, from 2 keV to 10 keV, or from 5 keV to 10 keV, and interacting a plurality of ions and/or neutralized ions from the ion source with the graphene and with the backside layer to introduce a plurality of defects in the graphene. The backside layer is located on a side of the graphene opposite the ion source. In an embodiment, the backside layer disperses an impact energy of the ions and/or neutralized ions with the backside layer into an area of the graphene surrounding the defects created upon interacting the ions and/or neutralized ions with the graphene and promotes expansion of the defects into holes.

The foregoing has outlined rather broadly the features of the present disclosure in order that the detailed description that follows can be better understood. Additional features and advantages of the disclosure will be described hereinafter. These and other advantages and features will become more apparent from the description below taken in conjunction with the drawings.

BRIEF DESCRIPTION OF THE DRAWINGS

For a more complete understanding of the present disclosure, and the advantages thereof, reference is now made to the following descriptions to be taken in conjunction with the accompanying drawings describing specific embodiments of the disclosure, wherein.

DETAILED DESCRIPTION

Figure 1:
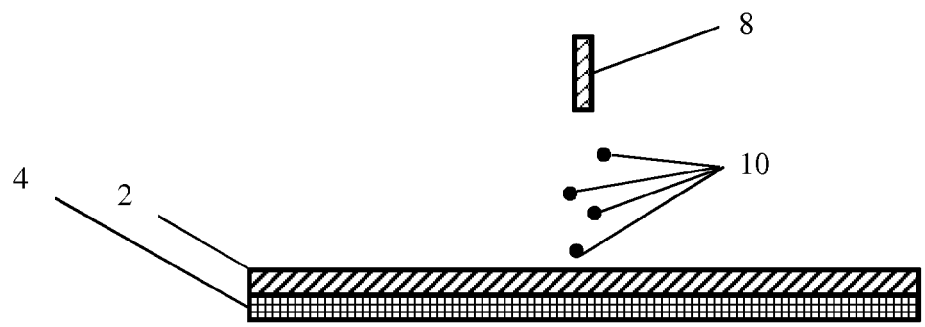
FIG. 1 and FIG. 2 show illustrative schematics of a frontside layer in continuous contact with graphene or another two-dimensional material.

The present disclosure is directed, in part, to various processes for producing a plurality of holes in graphene, graphene-based materials and other two-dimensional materials. In an embodiment, the first layer comprises a sheet of graphene-based material. Graphene-based materials include, but are not limited to, single layer graphene, multilayer graphene or interconnected single or multilayer graphene domains and combinations thereof. In an embodiment, graphene-based materials also include materials which have been formed by stacking single or multilayer graphene sheets. In embodiments, multilayer graphene includes 2 to 20 layers, 2 to 10 layers or 2 to 5 layers. In embodiments, graphene is the dominant material in a graphene-based material. For example, a graphene-based material comprises at least 30% graphene, or at least 40% graphene, or at least 50% graphene, or at least 60% graphene, or at least 70% graphene, or at least 80% graphene, or at least 90% graphene, or at least 95% graphene. In embodiments, a graphene-based material comprises a range of graphene selected from 30% to 95%, or from 40% to 80% from 50% to 70%, from 60% to 95% or from 75% to 100%.

As used herein, a "domain" refers to a region of a material where atoms are uniformly ordered into a crystal lattice. A domain is uniform within its boundaries, but different from a neighboring region. For example, a single crystalline material has a single domain of ordered atoms. In an embodiment, at least some of the graphene domains are nanocrystals, having domain size from 1 to 100 nm or 10-100 nm. In an embodiment, at least some of the graphene domains have a domain size greater than 100 nm to 1 micron, or from 200 nm to 800 nm, or from 300 nm to 500 nm. "Grain boundaries" formed by crystallographic defects at edges of each domain differentiate between neighboring crystal lattices. In some embodiments, a first crystal lattice may be rotated relative to a second crystal lattice, by rotation about an axis perpendicular to the plane of a sheet, such that the two lattices differ in "crystal lattice orientation".

In an embodiment, the sheet of graphene-based material comprises a sheet of single or multilayer graphene or a combination thereof. In an embodiment, the sheet of graphene-based material is a sheet of single or multilayer graphene or a combination thereof. In another embodiment, the sheet of graphene-based material is a sheet comprising a plurality of interconnected single or multilayer graphene domains. In an embodiment, the interconnected domains are covalently bonded together to form the sheet. When the domains in a sheet differ in crystal lattice orientation, the sheet is polycrystalline.

In embodiments, the thickness of the sheet of graphene-based material is from 0.34 to 10 nm, from 0.34 to 5 nm, or from 0.34 to 3 nm. In an embodiment, a sheet of graphene-based material comprises intrinsic defects. Intrinsic defects are those resulting from preparation of the graphene-based material in contrast to perforations which are selectively introduced into a sheet of graphene-based material or a sheet of graphene. Such intrinsic defects include, but are not limited to, lattice anomalies, pores, tears, cracks or wrinkles. Lattice anomalies can include, but are not limited to, carbon rings with other than 6 members (e.g. 5, 7 or 9 membered rings), vacancies, interstitial defects (including incorporation of non-carbon atoms in the lattice), and grain boundaries.

In an embodiment, the layer comprising the sheet of graphene-based material further comprises non-graphenic carbon-based material located on the surface of the sheet of graphene-based material. In an embodiment, the non-graphenic carbon-based material does not possess long range order and may be classified as amorphous. In embodiments, the non-graphenic carbon-based material further comprises elements other than carbon and/or hydrocarbons. Non-carbon elements which may be incorporated in the non-graphenic carbon include, but are not limited to, hydrogen, oxygen, silicon, copper and iron. In embodiments, the non-graphenic carbon-based material comprises hydrocarbons. In embodiments, carbon is the dominant material in non-graphenic carbon-based material. For example, a non-graphenic carbon-based material comprises at least 30% carbon, or at least 40% carbon, or at least 50% carbon, or at least 60% carbon, or at least 70% carbon, or at least 80% carbon, or at least 90% carbon, or at least 95% carbon. In embodiments, a non-graphenic carbon-based material comprises a range of carbon selected from 30% to 95%, or from 40% to 80%, or from 50% to 70%.

Such nanomaterials in which pores are intentionally created will be referred to herein as "perforated graphene", "perforated graphene-based materials" or "perforated two-dimensional materials." The present disclosure is also directed, in part, to perforated graphene, perforated graphene-based materials and other perforated two-dimensional materials containing a plurality of holes ranging from about 0.3 nm to about 10 nm in size. The present disclosure is further directed, in part, to perforated graphene, perforated graphene-based materials and other perforated two-dimensional materials containing a plurality of holes ranging from about 0.3 nm to about 10 nm in size and having a narrow size distribution, including but not limited to a 1-10% deviation in size or a 1-20% deviation in size. In an embodiment, the characteristic dimension of the holes is from 0.5 nm to 10 nm. For circular holes, the characteristic dimension is the diameter of the hole. In embodiments relevant to non-circular pores, the characteristic dimension can be taken as the largest distance spanning the hole, the smallest distance spanning the hole, the average of the largest and smallest distance spanning the hole, or an equivalent diameter based on the in-plane area of the pore. As used herein, perforated graphene-based materials include materials in which non-carbon atoms have been incorporated at the edges of the pores As discussed above, conventional processes for perforating graphene and other two-dimensional materials with a plurality of holes can be limited in terms of the obtained hole density, hole size and size distribution. Perforated nanomaterials having small holes with an effective size of about 10 nm or less can be particularly difficult to produce with a sufficient hole density and size distribution to support many intended applications. Filtration applications, for example, can be significantly impacted by an inability to produce holes of a selective size and hole density, as selectivity and throughput flux can be severely impacted. Moreover, presently available techniques for perforating graphene and other two-dimensional materials are not believed to be scalable to large dimensional areas (e.g., one to tens of square centimeters or more) in order to support commercial production efforts.

Current methods for perforating graphene and other two-dimensional materials include both chemical and physical processes. Chemical processes generally involve both hole nucleation and hole growth stages. However, hole nucleation and hole growth are usually difficult to separate from one another, thereby leading to a broad distribution of hole sizes. Physical processes generally involve a brute force knockout of atoms from the planar structure of the two-dimensional material. However, physical processes are rather energy inefficient, especially when considering their scaleup for commercial production efforts. Moreover, high energy ions can actually interact rather poorly with graphene and other two-dimensional materials, leading to a poor yield of atoms ejected during the knockout process.

In an embodiment, energetic ion perforation processes for graphene, graphene-based materials and other two-dimensional materials can be significantly enhanced by conducting the perforation process with at least one layer of a second material in continuous contact with the graphene or other two-dimensional material during its exposure to a broad field or flood ion source. A broad field or flood ion source can provide an ion flux which is significantly reduced compared to a focused ion beam. In an embodiment, the ion flux is from 0.1 nA/mm$^2$ to 100 nA/mm$^2$. By utilizing a broad ion field in conjunction with at least one layer in continuous contact with the graphene or other two-dimensional material, significantly improved perforation can be obtained in the form of small hole sizes, narrow size distributions, and high hole densities. In an embodiment, the hole density is characterized by the spacing between the holes. In an embodiment where the average pore size is from 0.5 nm to 2.5 nm, the average spacing between the pores is from 0.5 nm to 5 nm. The processes of the present disclosure are readily distinguished from focused ion beam processes, which have higher ion fluxes and/or ion energies. The broad ion field processes of the present disclosure are considerably more scalable in terms of areal coverage for commercial processing. Depending on their location, the layer(s) in continuous contact with the graphene or other two-dimensional material can impact the perforation process in several different ways, as discussed hereinafter.

In embodiments, the energetic ion perforation processes described herein utilize the knockout approach of physical perforation processes while also facilitating a discrete hole growth stage, like chemical processes. Unlike conventional chemical and physical perforation processes, however, the perforation processes of the present disclosure advantageously separate the hole nucleation and growth stages from one another while still allowing nucleation and growth to occur in a highly concerted fashion. In embodiments, the one or more layers in continuous contact with the graphene or other two-dimensional material allow highly concerted nucleation and growth to occur. Specifically, the one or more layers allow hole nucleation to be followed in short order by hole growth as a result of a single incident ion impact with the graphene or other two-dimensional material In conventional processes, hole nucleation and growth are not concerted. Because the hole nucleation and growth are separated but concerted stages in the processes of the present disclosure, a narrow hole size distribution can be obtained. Moreover, the processes of the present disclosure are advantageously suited to produce holes that are about 10 nm in size or under, which can be desirable for a number of applications, including filtration. Further, the hole size and/or hole density can be adjusted to suit the needs of a particular application. In an embodiment, a higher fluence or exposure time increases the number of holes (until the holes begin to overlap). Higher ion energies can either increase or decrease the hole size depending on the details of the interaction. The hole density can be modulated by adjusting the exposure time of the graphene or other two-dimensional material to the ion source.

Thus, the processes of the present disclosure are capable of providing all three of the key needs for perforated graphene, graphene-based materials and other two-dimensional materials (small hole size, narrow size distribution, and high hole density). Moreover, because they make use of a broad ion field for affecting perforation, the processes of the present disclosure are advantageously scalable to large dimensional areas and can support commercial processing efforts.

As indicated above, the broad ion field used to affect perforation in embodiments of the processes of the present disclosure provides ions with an ion energy ranging between about 0.75 keV and about 10 keV. In an embodiment the ion energy ranges from 1 keV to 10 keV. In an additional embodiment the ion energy ranges from 1 keV to 5 keV. In a further embodiment the ion energy ranges from 2 keV to 10 keV. In an additional embodiment the ion energy ranges from 5 keV to 10 keV. Some ions having energies within this range may interact poorly with graphene and other two-dimensional materials, producing only point defects in the planar structure in the form of 1-2 knocked out atoms per incident ion (single-vacancies and di-vacancies). In an embodiment, the holes produced by the processes of the present disclosure produce holes larger in size than such a point defect. The processes of the present disclosure, specifically the layer(s) in continuous contact with the graphene or other two-dimensional material, can produce holes larger in size than would be predicted on the basis of the ion energy alone. Without wishing to be bound by any particular belief, contact of the frontside or backside layer with the two-dimensional material during ion irradiation is believed to advantageously promote expansion of the defects into holes of meaningful size through converting the high energy incident ions into a thermal bombardment of the graphene or other two-dimensional material. Layers in different locations with respect to the ion source can facilitate this effect in several ways through bond energy mismatch, as discussed further herein below.

Although certain embodiments are described herein with graphene as the two-dimensional material, it is to be recognized that other two-dimensional materials can be used similarly in alternative embodiments unless otherwise specified herein. Thus, considerable flexibility can be realized by practicing the disclosure in order to produce a particular perforated two-dimensional material having a desired set of properties.

In various embodiments, processes described herein can include exposing a two-dimensional material in continuous contact with at least one layer to an ion source, and interacting a plurality of ions and/or neutralized ions from the ion source with the two-dimensional material and with the at least one layer. In embodiments, the ions and/or neutralized ions introduce a plurality of defects in the two-dimensional material and an interaction of the ions and/or neutralized ions with the at least one layer promotes expansion of the defects into a plurality of holes defined in the two-dimensional material. The at least one layer is in continuous contact with the two-dimensional material while the two-dimensional material is being exposed to the ion source.

In various embodiments, the two-dimensional material comprises graphene, molybdenum sulfide, or boron nitride. In more particular embodiments, the two-dimensional material can be graphene. Graphene according to the embodiments of the present disclosure can include single-layer graphene, multi-layer graphene, or any combination thereof. Other nanomaterials having an extended two-dimensional molecular structure can also constitute the two-dimensional material in the various embodiments of the present disclosure. For example, molybdenum sulfide is a representative chalcogenide having a two-dimensional molecular structure, and other various chalcogenides can constitute the two-dimensional material in the embodiments of the present disclosure. Choice of a suitable two-dimensional material for a particular application can be determined by a number of factors, including the chemical and physical environment into which the graphene or other two-dimensional material is to be terminally deployed.

In various embodiments of the present disclosure, the holes produced in the graphene or other two-dimensional material can range from about 0.3 nm to about 10 nm in size. In a more specific embodiment, the holes can range from about 0.5 nm to about 2.5 nm in size. In an additional embodiment, the hole size is from 0.3 to 0.5 nm. In a further embodiment, the hole size is from 0.5 to 10 nm. In an additional embodiment, the hole size is from 5 nm to 20 nm. In a further embodiment, the hole size is from 0.7 nm to 1.2 nm. In an additional embodiment, the hole size is from 10 nm to 50 nm. In embodiments where larger hole sizes are preferred, the hole size is from 50 nm to 100 nm, from 50 nm to 150 nm, or from 100 nm to 200 nm. Holes within these size ranges can be particularly desirable for filtration applications. The 0.5 nm to 2.5 nm size range can be particularly effective for use in reverse osmosis filtration applications.

Contact times for the graphene or other two-dimensional material with the ion source can range between about 0.1 seconds and about 120 second in order to produce an ion fluence sufficient to produce these hole densities. Longer contact times can be used if desired in order to modulate the number of holes obtained in the planar structure.

The ion source inducing perforation of the graphene or other two-dimensional material in the embodiments of the present disclosure is considered to provide a broad ion field, also commonly referred to as an ion flood source. In an embodiment, the ion flood source does not include focusing lenses. In embodiments, the ion source is operated at less than atmospheric pressure, such as at $10^{-3}$ to $10^{-5}$ torr or $10^{-4}$ to $10^{-6}$ torr. In an embodiment, the environment also contains background amounts (e.g. on the order of $10^{-5}$ torr) of oxygen ($O_2$), nitrogen ($N_2$) or carbon dioxide ($CO_2$). As indicated above, in an embodiment the ion source provides an ion dose ranging from $1 \times 10^{10}$ ions/cm$^2$ to $1 \times 10^{17}$ ions/cm$^2$ and having an ion energy ranging from 0.75 keV to 10 keV. In more particular embodiments, the ion energy can range from 1 keV to 10 keV or from 5 keV to 10 keV. In some embodiments, the ion dose can range between about $1 \times 10^{11}$ ions/cm$^2$ and about $1 \times 10^{15}$ ions/cm$^2$, between about $1 \times 10^{12}$ ions/cm$^2$ and about $1 \times 10^{14}$ ions/cm$^2$, or from $1 \times 10^{13}$ ions/cm$^2$ to $1 \times 10^{19}$ ions/cm$^2$. In an embodiment, the ion dose ranges from $1 \times 10^{10}$ ions/cm$^2$ to $1 \times 10^{17}$ ions/cm$^2$. In an additional embodiment the ion does ranges from $1 \times 10^{11}$ ions/cm$^2$ to $1 \times 10^{15}$ ions/cm$^2$. In a further embodiment, the ion dose ranges from $1 \times 10^{13}$ ions/cm$^2$ to $1 \times 10^{19}$ ions/cm$^2$. In an embodiment, the flux or beam current density is from 10 nA/nm$^2$ to 100 nA/nm$^2$. In embodiments, the ion beam may be perpendicular to the surface of the layers of the multi-layered material (incidence angle of 0 degrees) or the incidence angle may be from 0 to 45 degrees, 0 to 20 degrees, 0 to 15 degrees or 0 to 10 degrees.

The ion source can provide any of a variety of ions suitable for inducing perforations in graphene, graphene-based materials and other two-dimensional materials. In an embodiment, the ion is singly charged. In another embodiment, the ion is multiply charged. In an embodiment, the ion is a noble gas ion (ion of an element from Group 18 of the periodic table). In an embodiment, the ion is other than a helium ion. In an embodiment the ion is an organic ion or organometallic ion. In an embodiment, the organic or organometallic ion has an aromatic component. In an embodiment, the molecular mass of the organic ion or organometallic ion is from 75 to 200 or 90 to 200. In illustrative embodiments, ions that can be supplied from the ion source to induce perforation of graphene or another two-dimensional material can include $Xe^+$ ions, $Ne^+$ ions, $Ar^+$ ions, tropyllium ions ($C_7H_7^+$) and ferrocenium ions [($C_5H_5)_2Fe^+$].

In embodiments, when the ions are $Xe^+$ ions, $Ne^+$ ions, $Ar^+$ ions, the dose is $1 \times 10^{11}$ ions/cm$^2$ to $1 \times 10^{15}$ ions/cm$^2$. In embodiments, when the ion comprises a plurality of elements (such as tropyllium and ferrocenium), the fluence is $1 \times 10^{11}$ ions/cm$^2$ to $1 \times 10^{15}$ ions/cm$^2$. In an embodiment, helium ions are provided with a dose from $1 \times 10^{13}$ ions/cm$^2$ to $1 \times 10^{19}$ ions/cm$^2$. The chosen ion and its energy can determine, at least in part, the size of the holes obtained in the graphene or other two dimensional material. In particular embodiments, the chosen ion and its energy can be chosen to eject fragments from the at least one layer toward the graphene or other two-dimensional material.

In an embodiment, the temperature of the multilayer composite is controlled during ion bombardment. In embodiment, the temperature is controlled from −130° C. to 200° C. or from −130° C. to 100° C. In an embodiment, the temperature may be selected to allow condensation of a gas on the frontside of the two-dimensional material. In an embodiment, where a metal backside layer is present, the temperature may be controlled from 50° C. to 80° C. The one or more layers in continuous contact with the graphene or other two-dimensional material can be a frontside layer or a backside layer, or both can be present. The term "frontside" refers to the condition of being on the same side of the two-dimensional material as the ion source. The term "backside" refers to the condition of being on the side of the two-dimensional material opposite the ion source. Depending on its location, the at least one layer can be natively or exogenously present on the graphene or other two-dimensional material, or the at least one layer can be intentionally deposited after formation of the graphene or other two dimensional material. For example, a metal growth substrate can constitute a backside layer in various embodiments of the present disclosure.

Generally, the at least one layer has a bond energy that is weaker than that of graphene or the two-dimensional material, which is characterized by strong bonds. That is, when the at least one layer is interacted with the ion source, bonds are broken in the at least one layer in preference to the graphene or other two-dimensional material due to a bond energy mismatch. In some embodiments, the at least one layer can be a deposited layer such as deposited silicon, a deposited polymer, or any combination thereof. If the graphene or other two-dimensional material remains on its metal growth substrate, a deposited layer can constitute a frontside layer. However, if the graphene or other two-dimensional material has been removed from its metal growth substrate, a deposited layer can constitute either a frontside layer or a backside layer. Deposited polymers that can include any polymer material that suitably adheres to the graphene-based material or other two-dimensional material such as silicone polymers, for example. In an embodiment, the deposited polymer does not completely delaminate from the graphene-based material during ion bombardment. Other suitable polymer layers can be envisioned by one having ordinary skill in the art.

In some embodiments, a frontside layer deposited on the graphene or other two-dimensional material can have a thickness ranging between about 1 nm and about 10 nm. Thicker frontside layers can also be present, if desired. Although the frontside layer can be deposited exogenously during synthesis of the graphene or other two-dimensional material, the frontside layer can also be deposited in a separate operation in other embodiments. For example, the frontside layer can be deposited by sputtering, spraying, spin coating, atomic layer deposition, molecular beam epitaxy or like techniques in some embodiments.

Various layers will now be further described according to their location and function.

In some embodiments, the at least one layer can be at least a frontside layer disposed on the same side of the two-dimensional material as the ion source. Illustrative frontside layers can include those described above. When a frontside layer is present, ions from the ion source interact with the frontside layer before interacting with the graphene or other two-dimensional material. As discussed hereinafter, this type of interaction can still promote the creation and expansion of holes in the planar structure of the graphene or other two-dimensional material by ejecting layer fragments from the frontside layer and impacting the layer fragments with the graphene or other two-dimensional material to form holes therein. Since the frontside layer is relatively thin, it has a low stopping power and allows the ions and/or neutralized ions to penetrate through the frontside layer to further interact with the graphene.

In an embodiment, ion bombardment of the frontside layer generates a plume of more, but lower energy particles, impinging on the graphene or other two dimensional material. In more specific embodiments, processes of the present disclosure can include ejecting toward the two-dimensional material a plurality of layer fragments from the frontside layer upon interaction of ions and/or neutralized ions therewith, and impacting the layer fragments with the two-dimensional material in an area of the two-dimensional material surrounding the defects created upon interacting the ions and/or neutralized ions with the two-dimensional material and promoting expansion of the defects into holes. Layer fragments can include atoms, ions, molecules or molecular fragments displaced from the frontside layer upon interaction of a high energy ion with the frontside layer. A frontside layer can be present in combination with a backside layer or a frontside layer can be present alone. Functions of the backside layer are discussed further below.

Without being bound by theory or mechanism, it is believed that hole definition or generation in the presence of a frontside layer can take place due to several synergistic effects. First, the graphene or other two-dimensional material can have an enhanced degree of chemical reactivity in the vicinity of the defects initially created by the high energy ions and/or neutralized ions. Second, the layer fragments from the frontside layer can turn a single impact event at the frontside layer into a plurality of impact events at the graphene or other two-dimensional material. Third, the layer fragments have a lower energy than do the incident high energy ions, thereby increasing the likelihood of successfully interacting with the graphene or other two-dimensional material in order to define a hole. Finally, because the frontside layer and the graphene or other two-dimensional material are in continuous contact with one another, the geometric spread of the layer fragments during their transit to the graphene or other two-dimensional material is minimal, thereby limiting the hole size. Thus, the combination of enhanced chemical reactivity in the vicinity of the defects and the more efficient interaction of the layer fragments with the graphene or other two-dimensional material can result in the definition of a hole.

Figure 2:
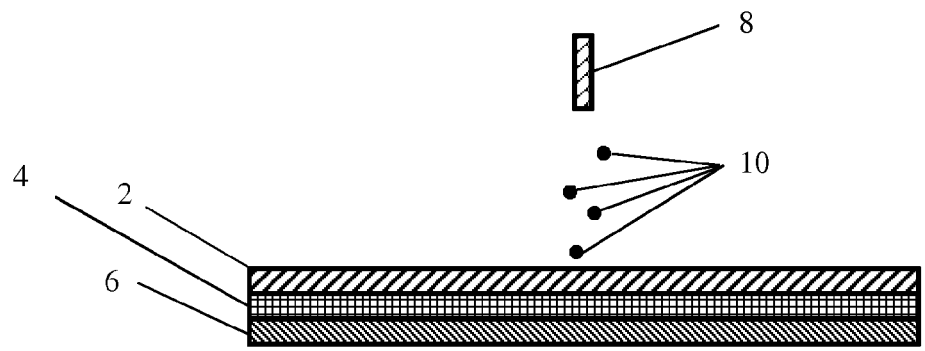

FIGS. 1 and 2 show illustrative schematics of frontside layer 2 in continuous contact with graphene 4 or another two-dimensional material. In FIG. 1, only frontside layer 2 is present, and in FIG. 2, both frontside layer 2 and backside layer 6 are present. Ion source 8 is configured to supply a dose of ions 10 for perforating graphene 4.

Figure 3A:
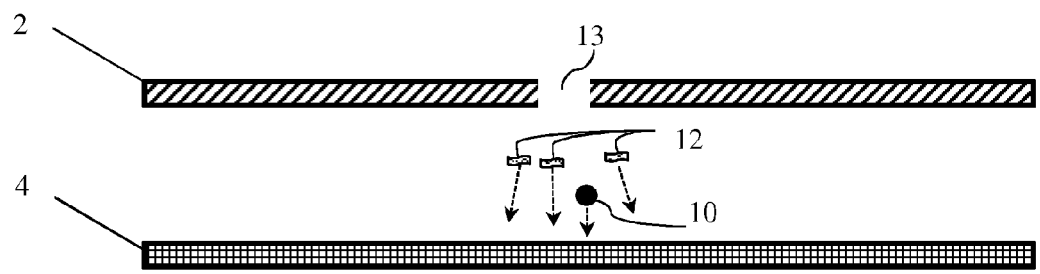
FIG. 3A, FIG. 3B and FIG. 3C show illustrative schematics demonstrating how the interaction of an ion with a frontside layer and with graphene or another two-dimensional material can define a hole in the graphene or other two-dimensional material.
Figure 3B:
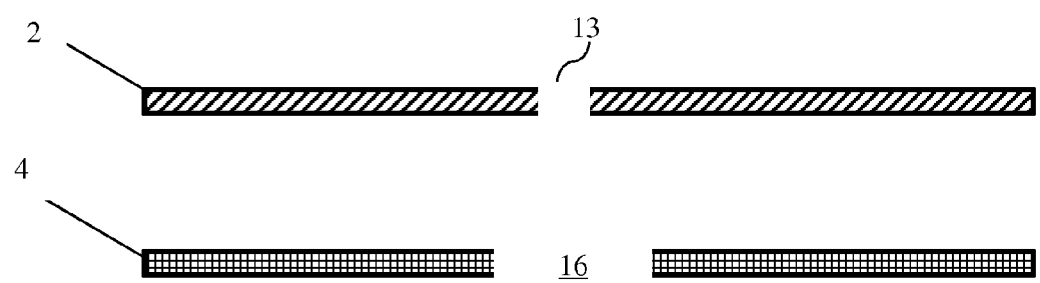
Figure 3C:
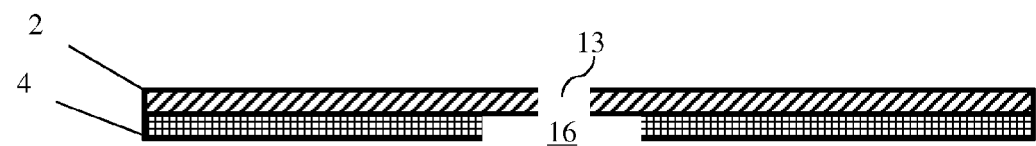

FIGS. 3A, 3B and 3C show illustrative schematics demonstrating how the interaction of an ion with a frontside layer and with graphene or another two-dimensional material can define a hole in the graphene or other two-dimensional material. In the interest of clarity of description and depiction, frontside layer 2 and graphene 4 are shown in an exploded view and in a spaced apart configuration in FIGS. 3A and 3B, rather than in their true configuration of being in continuous contact with one another. FIG. 3A shows frontside layer 2 and graphene 4 after ion 10 has impacted and passed through the frontside layer. Layer fragments 12 are ejected from frontside layer 2 and are scattered at thermal velocities/energies and/or hyperthermal velocities/energies toward graphene 4. In an embodiment this scattering may be referred to as ballistic scattering. A defect 13 is created in the frontside layer. A defect 14 (not shown in FIG. 3A) may be introduced in graphene 4 upon the passage of ion 10 through the planar structure of graphene 4. Again, it is to be emphasized that frontside layer 2 and graphene 4 are, in fact, in continuous contact with one another, thereby minimizing the degree of ballistic scattering that takes place as layer fragments 12 transit from frontside layer 2 to graphene 4. In an embodiment, layer fragments 12 impact graphene 4 in close proximity to defect 14, where the chemical reactivity is enhanced. In an embodiment, layer fragments 12 then result in expansion of defect 14 to define hole 16, as shown in FIG. 3B. FIG. 3C shows frontside layer 2 and graphene 4 in their true continuous contact configuration after the creation of hole 16. As exemplified by FIGS. 3A-3C, the stages of hole nucleation (i.e., formation of a defect in the graphene by direct interaction of the ion) and hole growth (i.e., impact of layer fragments 12 with graphene4) are separated, yet highly concerted processes. Therefore, holes 16 of defined size and having a narrow size distribution can be obtained.

As shown in FIG. 3B, frontside layer 2 can at least partially cover hole 16 following its creation. In some embodiments, frontside layer 2 can be removed following the definition of holes 16 in order to increase the effective permeability of graphene 4. Illustrative frontside layer removal techniques can include, for example, oxidation, solvent washes, heating, or any combination thereof. Oxidation techniques include, but are not limited to, ultraviolet-oxygen (UVO) treatment using reactive oxygen species. Depending on the composition of frontside layer 2, one having ordinary skill in the art will be able to choose a suitable removal process.

In some embodiments, the at least one layer in continuous contact with the graphene or other two dimensional material can be a backside layer disposed on a side of the graphene or other two-dimensional material opposite the ion source. In an embodiment, the backside layer is a metal growth substrate upon which the graphene or other two-dimensional material is grown, or the backside layer can be a secondary substrate to which the graphene or other two-dimensional material has been transferred following growth. In an embodiment, the secondary substrate is polymeric, including porous polymeric membranes. In either case, the backside layer can have a thickness that is significantly greater than that of the graphene or other two-dimensional material. Accordingly, the backside layer can have a much higher stopping power for the energetic ions and/or neutralized ions than does the graphene or other two-dimensional material. Upon stopping the energetic ions, the backside layer can disperse an impact energy of the ions and/or neutralized ions with the backside layer into an area of the graphene or other two-dimensional material surrounding the defects created upon interacting the ions with the two-dimensional material and promoting the expansion of the defects into holes. In more specific embodiments, a backside layer promotes expansion of defects in a two-dimensional material into holes in a manner somewhat similar to that described above for a frontside layer, in which fragments are directed towards the two-dimensional material. The backside layer may also promote formation of defects in the two-dimensional material. For example, even when an ion or neutralized ion does not form a hole when passing through the two-dimensional material, impact of the ions and/or neutralized ions with the backside layer may cause a small region in the backside layer to rapidly heat and expand, opening a hole in the graphene or other two-dimensional material.

Figure 4A:
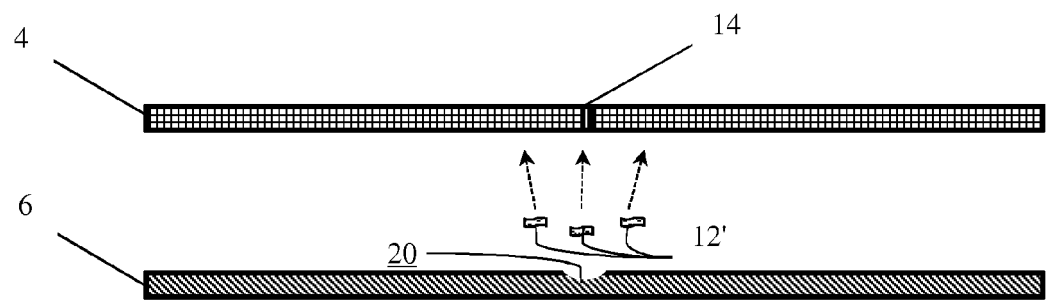
FIG. 4A, FIG. 4B and FIG. 4C show illustrative schematics demonstrating how the interaction of an ion with a backside layer and with graphene or another two-dimensional material can define a hole in the graphene or other two-dimensional material.
Figure 4B:
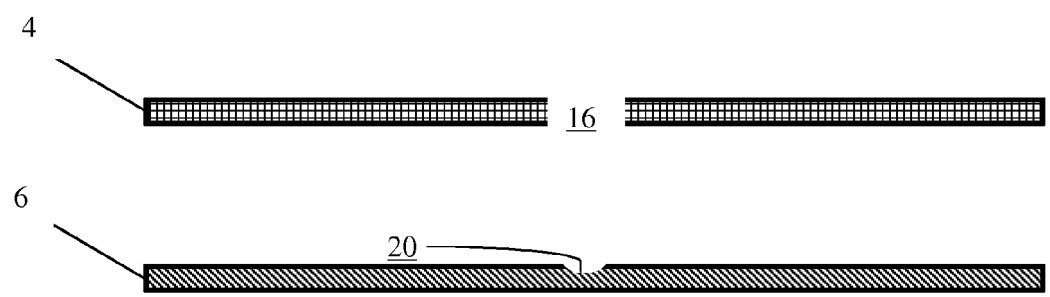
Figure 4C:
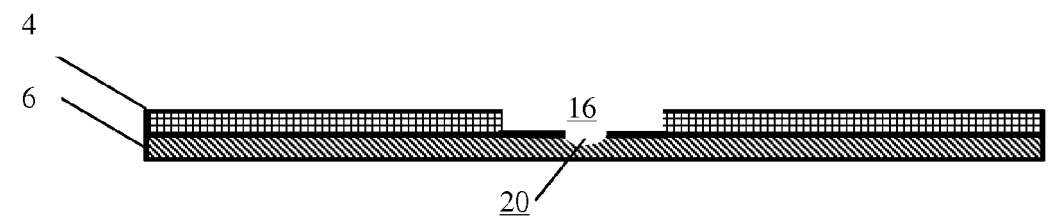

FIGS. 4A, 4B and 4C show illustrative schematics demonstrating how the interaction of an ion with a backside layer and with graphene or another two-dimensional material can define a hole in the graphene or other two-dimensional material. Again, in the interest of clarity of description and depiction, backside layer 6 and graphene 4 are shown in an exploded view and in a spaced apart configuration in FIGS. 4A and 4B, rather than in their true configuration of being in continuous contact with one another. FIG. 4A shows graphene 4 or another two-dimensional material and backside layer 6 immediately after an ion has passed through graphene 4 and impacted backside layer 6. Defect 14 is generated in graphene 4 upon passage of the ion therethrough. In the case of backside layer 6, the ion embeds in impact region 20, thereby resulting in ejection of layer fragments 12' therefrom. In FIG. 4A, impact region 20 is shown as a crater. Layer fragments 12' can include those described above for frontside layer 2. For example, when backside layer 6 is the metal growth substrate upon which graphene 4 or another two-dimensional material is grown, layer fragments 12' can be metal atoms or metal ions sputtered from the metal growth substrate upon kinetic energy transfer from the ion to backside layer 6. Layer fragments 12' are ejected toward graphene 4 at thermal velocities and again impact in close proximity to defect 14 to result in its expansion into hole 16, as depicted in FIG. 4B. In the configuration of FIGS. 4A and 4B, layer fragments 12' impact graphene 4 from its underside, rather than from its topside as in FIGS. 3A and 3B. Again, it is to be emphasized that backside layer 6 and graphene 4 are, in fact, in continuous contact with one another, thereby minimizing the degree of scattering that takes place as layer fragments 12' transit from backside layer 6 to graphene 4. As shown, layer fragments 12' impact graphene 4 in close proximity to defect 14 to where the chemical reactivity is enhanced. FIG. 4C shows backside layer 6 and graphene 4 in their true continuous contact configuration after the creation of hole 16. As exemplified by FIGS. 4A-4C, the stages of hole nucleation (i.e., formation of defect 14) and hole growth (i.e., impact of layer fragments 12' with graphene 4) are again separated, yet highly concerted processes. Because there is minimal geometric scattering as layer fragments 12' transit between backside layer 6 and graphene 4, holes 16 having a defined size and a narrow size distribution can be obtained.

Illustrative metal growth substrates upon which graphene, graphene-based materials and other two-dimensional materials can be grown and which can serve as the backside layer in the embodiments of the present disclosure include various metal surfaces containing a transition metal. In the case of graphene, for example, copper or nickel can be particularly effective for promoting epitaxial graphene growth. In some embodiments, the metal growth substrate can be formed substantially entirely of a metal, such as a metal foil or a metal sheet. In other embodiments, the metal growth substrate can include a metal surface on a different subsurface material. For example, a ceramic substrate having a metal surface can be used as the metal growth substrate and backside layer in various embodiments of the present disclosure.

Accordingly, in some embodiments, processes of the present disclosure can include ejecting toward the two-dimensional material, such as graphene, a plurality of layer fragments from the backside layer upon interaction of the ions and/or neutralized ions therewith, and impacting the layer fragments with the two-dimensional material in an area of the two-dimensional material surrounding the defects and promoting expansion of the defects into holes. That is, the backside layer can promote energy transfer to the graphene or other two-dimensional material in the form of layer fragments having thermal velocities in order to promote the creation of holes in the graphene or other two-dimensional material.

In some embodiments, both a frontside layer and a backside layer can be in continuous contact with the graphene or other two-dimensional material as it is interacted with the ions and/or neutralized ions from the ion source. The layer fragments generated from both the frontside layer and the backside layer can work in concert with one another to expand the generated defects in the graphene or other two-dimensional material into a plurality of holes. For example, in some embodiments, layer fragments generated from a suitable frontside layer and metal atoms or metal ions generated from a backside metal growth substrate can impact graphene from both sides of its planar structure to promote the creation of holes therein. This can be particularly effective for perforating multi-layer two-dimensional materials, such as multi-layer graphene, for example by holding the particles in a local region.

Accordingly, in embodiments where both a frontside layer and a backside layer are present, processes of the present disclosure can include ejecting toward the graphene or other two-dimensional material a plurality of layer fragments from the frontside layer upon interaction of the ions and/or neutralized ions therewith, ejecting toward the graphene or other two-dimensional material a plurality of layer fragments from the backside layer upon interaction of the ions and/or neutralized ions therewith, and impacting the layer fragments from both layers with the graphene or other two-dimensional material in an area surrounding the defects created upon interacting the ions and/or neutralized ions with the graphene or other two-dimensional material and promoting the expansion of the defects into holes.

In particular embodiments, processes of the present disclosure can include providing graphene on a metal growth substrate, exposing the graphene to an ion source, interacting a plurality of ions from the ion source with the graphene and with the metal growth substrate to introduce a plurality of defects in the graphene and an interaction of the ions and/or neutralized ions with the metal growth substrate ejecting toward the graphene a plurality of layer fragments including metal ions or metal atoms from the metal growth substrate, and expanding the defects in the graphene with the layer fragments to define a plurality of holes in the graphene. In an embodiment, the ion source provides to the graphene an ion dose ranging between about $1 \times 10^{11}$ ions/cm$^2$ and about $1 \times 10^{17}$ ions/cm$^2$ and having an ion energy ranging between about 0.75 keV and about 10 keV. The metal growth substrate is disposed on a side of the graphene opposite the ion source and constitutes a backside layer.

In some embodiments, the graphene can be coated with a frontside layer opposite the metal growth substrate that is disposed on the same side of the graphene as the ion source (see FIG. 2, for example). The frontside layer can be formed from various materials and can have a thickness ranging between about 1 nm and about 10 nm, for example. In some embodiments, the processes can further include removing the frontside layer after defining the plurality of holes in the graphene.

In other particular embodiments, processes of the present disclosure can include exposing graphene to an ion source, the graphene having thereon a frontside layer disposed on the same side of the graphene as the ion source, interacting a plurality of ions and/or neutralized ions from the ion source with the graphene and with the frontside layer to introduce a plurality of defects in the graphene and an interaction of the ions and/or neutralized ions with the frontside layer ejecting toward the graphene a plurality of layer fragments, and expanding the defects in the graphene with the layer fragments to define a plurality of holes in the graphene. In an embodiment, the ion source provides to the graphene an ion dose ranging between about $1\times10^{11}$ ions/$cm^2$ and about $1\times10^{17}$ ions/$cm^2$ and having an ion energy ranging between about 0.75 keV and about 10 keV.

In still other particular embodiments, processes of the present disclosure can include exposing graphene to an ion source, the graphene being present on a backside layer located on a side of the graphene opposite the ion source, interacting a plurality of ions and/or neutralized ions from the ion source with the graphene and with the backside layer to introduce a plurality of defects in the graphene and an interaction of the ions and/or neutralized ions with the backside layer dispersing an impact energy of the ions and/or neutralized ions with the backside layer into an area of the graphene surrounding the defects created upon interacting the ions with the graphene an promoting expansion of the defects into holes. In an embodiment, the ion source provides to the graphene an ion dose ranging between about $1\times10^{10}$ ions/$cm^2$ and about $1\times10^{17}$ ions/$cm^2$ and having an ion energy ranging between about 0.75 keV and about 10 keV.

In more specific particular embodiments, processes of the present disclosure can include exposing graphene to an ion source, the graphene being present on a backside layer located on a side of the graphene opposite the ion source, interacting a plurality of ions and/or neutralized ions from the ion source with the graphene and with the backside layer to introduce a plurality of defects in the graphene and an interaction of the ions and/or neutralized ions with the backside layer ejecting toward the graphene a plurality of layer fragments, and expanding the defects in the graphene with the layer fragments to define a plurality of holes in the graphene. In an embodiment, the ion source provides to the graphene an ion dose ranging between about $1\times10^{10}$ ions/$cm^2$ and about $1\times10^{17}$ ions/$cm^2$ and having an ion energy ranging between about 0.75 keV and about 10 keV.

The perforated graphene, graphene-based materials and other two-dimensional materials described herein can be used in a variety of applications including filtration, electronics, barrier layers and films, gas barriers, and the like. Illustrative filtration applications in which the perforated graphene, graphene-based materials and other perforated two-dimensional materials can be used include, for example, reverse osmosis, molecular filtration, ultrafiltration and nanofiltration processes. When used in various filtration processes, the perforated graphene or other perforated two-dimensional material can be perforated and then transferred to a porous secondary substrate, where the perforated graphene or other perforated two-dimensional filtration serves as the active filtration membrane.

Although the invention has been described with reference to the disclosed embodiments, those skilled in the art will readily appreciate that these only illustrative of the invention. It should be understood that various modifications can be made without departing from the spirit of the invention. The invention can be modified to incorporate any number of variations, alterations, substitutions or equivalent arrangements not heretofore described, but which are commensurate with the spirit and scope of the invention. Additionally, while various embodiments of the invention have been described, it is to be understood that aspects of the invention may include only some of the described embodiments. Accordingly, the invention is not to be seen as limited by the foregoing description.

Every formulation or combination of components described or exemplified can be used to practice the invention, unless otherwise stated. Specific names of compounds are intended to be exemplary, as it is known that one of ordinary skill in the art can name the same compounds differently. When a compound is described herein such that a particular isomer or enantiomer of the compound is not specified, for example, in a formula or in a chemical name, that description is intended to include each isomers and enantiomer of the compound described individual or in any combination. One of ordinary skill in the art will appreciate that methods, device elements, starting materials and synthetic methods other than those specifically exemplified can be employed in the practice of the invention without resort to undue experimentation. All art-known functional equivalents, of any such methods, device elements, starting materials and synthetic methods are intended to be included in this invention. Whenever a range is given in the specification, for example, a temperature range, a time range, or a composition range, all intermediate ranges and subranges, as well as all individual values included in the ranges given are intended to be included in the disclosure. When a Markush group or other grouping is used herein, all individual members of the group and all combinations and subcombinations possible of the group are intended to be individually included in the disclosure.

As used herein, "comprising" is synonymous with "including," "containing," or "characterized by," and is inclusive or open-ended and does not exclude additional, unrecited elements or method steps. As used herein, "consisting of" excludes any element, step, or ingredient not specified in the claim element. As used herein, "consisting essentially of" does not exclude materials or steps that do not materially affect the basic and novel characteristics of the claim. Any recitation herein of the term "comprising", particularly in a description of components of a composition or in a description of elements of a device, is understood to encompass those compositions and methods consisting essentially of and consisting of the recited components or elements. The invention illustratively described herein suitably may be practiced in the absence of any element or elements, limitation or limitations which is not specifically disclosed herein.

The terms and expressions which have been employed are used as terms of description and not of limitation, and there is no intention in the use of such terms and expressions of excluding any equivalents of the features shown and described or portions thereof, but it is recognized that various modifications are possible within the scope of the invention claimed. Thus, it should be understood that although the present invention has been specifically disclosed by preferred embodiments and optional features, modification and variation of the concepts herein disclosed may be resorted to by those skilled in the art, and that such modifications and variations are considered to be within the scope of this invention as defined by the appended claims.

In general the terms and phrases used herein have their art-recognized meaning, which can be found by reference to standard texts, journal references and contexts known to those skilled in the art. The preceding definitions are provided to clarify their specific use in the context of the invention.

All references throughout this application, for example patent documents including issued or granted patents or equivalents; patent application publications; and non-patent literature documents or other source material; are hereby incorporated by reference herein in their entireties, as though individually incorporated by reference, to the extent each reference is at least partially not inconsistent with the disclosure in this application (for example, a reference that is partially inconsistent is incorporated by reference except for the partially inconsistent portion of the reference).

All patents and publications mentioned in the specification are indicative of the levels of skill of those skilled in the art to which the invention pertains. References cited herein are incorporated by reference herein in their entirety to indicate the state of the art, in some cases as of their filing date, and it is intended that this information can be employed herein, if needed, to exclude (for example, to disclaim) specific embodiments that are in the prior art. For example, when a compound is claimed, it should be understood that compounds known in the prior art, including certain compounds disclosed in the references disclosed herein (particularly in referenced patent documents), are not intended to be included in the claim.

What is claimed is the following:

1. A process comprising:
   exposing a multilayered material to ions provided by an ion source, the multilayered material comprising a first layer comprising a two-dimensional first material and a second layer of a second material in contact with the first layer, the ions being provided with an ion energy ranging from 1.0 keV to 10 keV, and a flux from 0.1 nA/mm$^2$ to 100 nA/mm$^2$; and
   producing a plurality of holes in the two-dimensional first material by interacting a plurality of ions provided by the ion source, neutralized ions or a combination thereof with the two-dimensional first material and with the second material.

2. The process of claim 1, wherein the ion energy is from 1 keV to 5 keV.

3. The process of claim 1, wherein the ion source is a broad beam source.

4. The process of claim 1, wherein the multilayered material is exposed to an ion dose ranging from $1\times10^{11}$ ions/cm$^2$ to $1\times10^{15}$ ions/cm$^2$ and the ion source provides ions selected from the group consisting of Xe$^+$ ions, Ne$^+$ ions, or Ar$^+$ ions.

5. The process of claim 1, wherein the multilayered material is exposed to an ion dose ranging from $1\times10^{11}$ ions/cm$^2$ to $1\times10^{15}$ ions/cm$^2$ and the ion source provides organic or organometallic ions having a molecular mass from 90 to 200.

6. The process of claim 5, wherein the ion is selected from the group consisting of tropyllium ions and ferrocenium ions.

7. The process of claim 1, wherein the two-dimensional first material comprises graphene.

8. The process of claim 7, wherein the first layer comprises a sheet of a graphene-based material.

9. The process of claim 1, wherein the characteristic dimension of the holes is from 0.5 nm to 2.5 nm.

10. The process of claim 1, wherein the characteristic dimension of the holes is from 1 nm to 10 nm.

11. The process of claim 1, wherein the first layer has a first side and a second side, the first side facing the ion source and the second layer being disposed on the second side of the first layer and having a thickness greater than that of the first layer.

12. The process of claim 11, wherein the second material comprises a metal.

13. The process of claim 12, wherein the second layer comprises a metal growth substrate for the two-dimensional first material and the fragments comprise metal atoms or metal ions ejected from the metal growth substrate.

14. The process of claim 11, wherein the interaction of at least a portion of the ions, neutralized ions, or a combination thereof with the first material introduces a plurality of defects in the first material, a plurality of the ions, neutralized ions, or a combination thereof pass through the first layer comprising the first material to interact with the second material and interaction of the ions, neutralized ions, or a combination thereof with the second material of the second layer promotes expansion of the defects into holes.

15. The process of claim 14, wherein the second material interacts with the ions, neutralized ions, or a combination thereof to produce fragments of the second material, at least some of the fragments of the second material being directed towards the two dimensional material.

16. The process of claim 11, wherein the multilayered material further comprises a third layer of a third material disposed on the first side of the first layer, the third layer having an average thickness ranging from 1 nm to 10 nm.

17. The process of claim 16, wherein the third layer comprises comprises deposited silicon, a deposited polymer, a condensed gas, a condensed organic compound or a combination thereof.

18. The process of claim 16, wherein a plurality of the ions, neutralized ions, or a combination thereof pass through the third layer of the third material to interact with the first material, the interaction of ions, neutralized ions, or a combination thereof with the first (2D) material introducing a plurality of defects in the first material, a plurality of the ions, neutralized ions, or a combination thereof pass through the first layer comprising the first material to interact with the second material and the interaction of at least a portion of the ions, neutralized ions, or a combination thereof with the second material and the third material promotes expansion of the defects into holes.

19. The process of claim 18, wherein the third material interacts with ions, neutralized ions, or a combination thereof to produce fragments of the third material, at least some of the fragments of the third material being directed towards the two dimensional material.

20. The process of claim 1, wherein the first layer has a first side and a second side, the first side facing the ion source and the second layer being disposed on the first side of the first layer, the second layer having an average thickness ranging from 1 nm to 10 nm.

21. The process of claim 20, wherein the second layer comprises comprises deposited silicon, a deposited polymer, a condensed gas, a condensed organic compound or a combination thereof.

22. The process of claim 20, wherein a plurality of the ions, neutralized ions, or a combination thereof pass through the second layer of the second material to interact with the two dimensional material, the interaction of ions, neutralized ions, or a combination thereof with the first material introducing a plurality of defects in the first material and the interaction of at least a portion of the ions, neutralized ions, or a combination thereof with the second material promoting expansion of the defects into holes.

23. The process of claim 22, wherein the second material interacts with the ions, neutralized ions, or a combination thereof to produce fragments of the second material, at least some of the fragments of the second material being directed towards the first material.

* * * * *